United States Patent
Kim et al.

(10) Patent No.: US 9,165,820 B2
(45) Date of Patent: *Oct. 20, 2015

(54) INTEGRATED CIRCUIT DEVICES INCLUDING INTERCONNECTIONS INSULATED BY AIR GAPS AND METHODS OF FABRICATING THE SAME

(71) Applicant: Samsung Electronics Co., Ltd, Suwon-si (KR)

(72) Inventors: Jeeyong Kim, Hwaseong-si (KR); Hyunchul Back, Suwon-si (KR); Jung-Hwan Lee, Seoul (KR); Hyunmin Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/451,650

(22) Filed: Aug. 5, 2014

(65) Prior Publication Data

US 2014/0342548 A1    Nov. 20, 2014

Related U.S. Application Data

(63) Continuation of application No. 13/779,174, filed on Feb. 27, 2013, now Pat. No. 8,829,682.

(30) Foreign Application Priority Data

Mar. 2, 2012    (KR) .......................... 10-2012-0021675

(51) Int. Cl.
*H01L 21/768*    (2006.01)
*H01L 23/48*    (2006.01)
*H01L 23/522*    (2006.01)

(52) U.S. Cl.
CPC ...... *H01L 21/7682* (2013.01); *H01L 21/76877* (2013.01); *H01L 23/481* (2013.01); *H01L 23/522* (2013.01); *H01L 2924/0002* (2013.01)

(58) Field of Classification Search
CPC ................... H01L 21/7682; H01L 21/76831; H01L 21/76829; H01L 23/5226

See application file for complete search history.

(56) References Cited

U.S. PATENT DOCUMENTS

| | | | |
|---|---|---|---|
| 5,904,525 | A | 5/1999 | Hshieh et al. |
| 8,030,779 | B2 | 10/2011 | Park |
| 2010/0029076 | A1 | 2/2010 | Daamen et al. |
| 2010/0130001 | A1 | 5/2010 | Noguchi |
| 2010/0244255 | A1 | 9/2010 | Lee |
| 2011/0027985 | A1 | 2/2011 | Tsumura et al. |
| 2011/0183516 | A1 | 7/2011 | Lee |
| 2011/0249497 | A1 | 10/2011 | Yun |

FOREIGN PATENT DOCUMENTS

| | | |
|---|---|---|
| JP | 2005-136152 | 5/2005 |
| KR | 1020060005182 A | 1/2006 |
| KR | 1020060114181 A | 11/2006 |
| KR | 1020100122701 A | 11/2010 |
| KR | 1020110078858 A | 7/2011 |

*Primary Examiner* — Whitney T Moore
(74) *Attorney, Agent, or Firm* — Myers Bigel Sibley & Sajovec, PA

(57) ABSTRACT

Semiconductor devices and methods of fabricating the same are provided. The semiconductor device may include interconnections extending in a first direction on a substrate and spaced apart from each other in a second direction perpendicular to the first direction, barrier dielectric patterns disposed on top surfaces of the interconnections, respectively, and an upper interlayer dielectric layer disposed on the interconnection. Respective air gaps are disposed between adjacent ones of the interconnections.

18 Claims, 23 Drawing Sheets

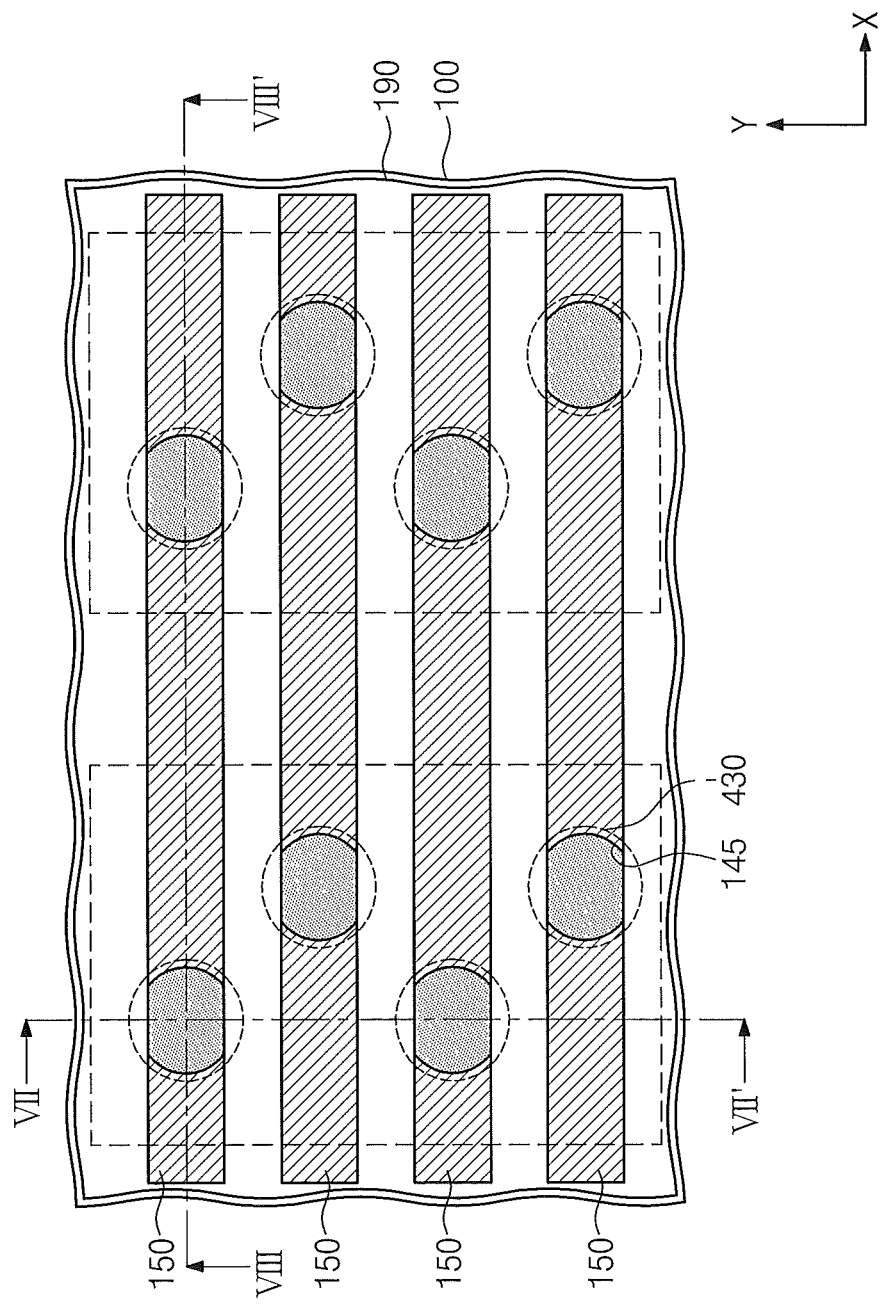

INTEGRATED CIRCUIT DEVICES INCLUDING INTERCONNECTIONS INSULATED BY AIR GAPS AND METHODS OF FABRICATING THE SAME

CROSS-REFERENCE TO RELATED APPLICATIONS

This application is a continuation of U.S. patent application Ser. No. 13/779,174 filed Feb. 27, 2013 which claims priority under 35 U.S.C. §119 to Korean Patent Application No. 10-2012-0021675, filed on Mar. 2, 2012, the entireties of which is incorporated by reference herein.

BACKGROUND

The inventive concept relates to integrated circuit devices, and more particularly, to integrated circuit devices including interconnection structures and methods of fabricating the same.

Semiconductor devices may be attractive in the electronics industry due to their small size, multi-functionality, and/or low fabrication cost. The semiconductor devices can be categorized as any one of semiconductor memory devices that store logic data, semiconductor logic devices that process operations on logical data, and hybrid semiconductor devices having both the function of the semiconductor memory devices and the function of the semiconductor logic devices.

High speed semiconductor devices and/or low voltage semiconductor devices may be increasingly desired to satisfy demand for higher speed and lower power consumption in electronic devices. The semiconductor devices may be more highly integrated in order to meet such demands. However, as semiconductor devices become more highly integrated, reliability of the semiconductor devices may deteriorate. But, maintaining high reliability of the semiconductor devices may also be desired with the development of an electronic industry. Thus, various research has been conducted for improving the reliability of the semiconductor devices.

SUMMARY

Embodiments of the inventive concept may provide semiconductor devices having higher reliability and methods of fabricating the same.

Embodiments of the inventive concept may also provide semiconductor devices with high integration and methods of fabricating the same.

In some aspects, a semiconductor device may include: interconnections extending in a first direction on a substrate, the interconnections spaced apart from each other in a second direction perpendicular to the first direction; barrier dielectric patterns disposed on top surfaces of the interconnections, respectively; and an upper interlayer dielectric layer disposed on the interconnection. An air gap may be disposed between the interconnections adjacent to each other.

In some embodiments, the barrier dielectric patterns may extend in the first direction and be spaced apart from each other in the second direction.

In other embodiments, the semiconductor device may further include: a spacer covering each of the barrier dielectric patterns and upper portions of both sidewalls of each of the interconnections. The spacer may include a top surface portion and sidewall portions vertically and downward extending from both ends of the top surface portion. A bottom surface of the sidewall portion of the spacer may be disposed at a height between a top surface and a bottom surface of the interconnection. A distance between the spacers adjacent to each other may be smaller than a distance between the interconnections adjacent to each other.

In still other embodiments, the air gap may be surrounded by the spacers, the interconnections, and the upper interlayer dielectric layer. The semiconductor device may further include: a mold layer disposed on the substrate. The interconnections may be disposed on the mold layer, and portions of the interconnections downward extend to penetrate the mold layer.

In yet other embodiments, the barrier dielectric patterns may include at least one of silicon nitride, metal nitride, and cobalt compound. The spacers may include at least one of silicon compounds of SiN, SiON, SiC, and SiCN, metals of Ti and Ta, and metal nitrides of TiN and TaN.

In other aspects, a semiconductor device may include: a plurality of cell strings disposed on a substrate, each of the cell strings including a string selection transistor, a ground selection transistor, and a plurality of cell transistors connected in series between the string and ground selection transistors; interconnections disposed on the cell strings and extending in parallel to each other in one direction, the interconnections electrically connected to drains of the string selection transistors, respectively; barrier dielectric patterns disposed on top surfaces of the interconnections, respectively; and an upper interlayer dielectric layer disposed on the interconnections. An air gap may be disposed between the interconnections adjacent to each other.

In still other aspects, a method of fabricating a semiconductor device may include: forming an interconnection-mold layer on a substrate; forming recess regions in the interconnection-mold layer, the recess regions extending in parallel to each other in a first direction and spaced apart from each other in a second direction perpendicular to the first direction; forming interconnections in the recess regions, respectively; forming barrier dielectric patterns on the interconnections, respectively; forming spacers covering the barrier dielectric patterns and the interconnections, respectively; removing the interconnection-mold layer between the interconnections; and forming an upper interlayer dielectric layer on the interconnections so as to form air gaps between the interconnections.

In some embodiments, forming the barrier dielectric patterns may include: etching upper portions of the interconnections; forming a barrier dielectric layer on the etched interconnections; and planarizing the barrier dielectric layer until the interconnection-mold layer is exposed.

In other embodiments, forming the spacers may include: etching a portion of the interconnection-mold layer; and forming spacers covering exposed barrier dielectric patterns and exposed interconnections.

In still other embodiments, the barrier dielectric patterns and the spacers may include materials having an etch selectivity with respect to the interconnection-mold layer.

In yet other aspects, an integrated circuit device includes a plurality of conductive interconnections extending substantially parallel along a substrate and spaced apart from one another by respective air gaps therebetween. An upper dielectric layer is disposed on the plurality of interconnections, and respective barrier dielectric layers are disposed between the conductive interconnections and the upper dielectric layer. The barrier dielectric layers may include silicon nitride, metal nitride, and/or cobalt.

In some embodiments, the respective air gaps may continuously extend from a sidewall of one of the conductive interconnections to a sidewall of another of the conductive interconnections adjacent thereto.

In some embodiments, sidewalls of the conductive interconnections may be free of the barrier dielectric layers.

In some embodiments, respective spacer layers may be provided on the conductive interconnections between the barrier dielectric layers and the upper dielectric layer. The respective spacer layers may extend toward the substrate along the sidewalls of the conductive interconnections and beyond respective surfaces of the conductive interconnections including the barrier dielectric layers thereon.

In some embodiments, the respective air gaps may continuously extend along lengths of the conductive interconnections. The respective air gaps may be bounded by the spacer layers, the sidewalls of the interconnections, and the upper dielectric layer.

In some embodiments, the conductive interconnections may define bit lines of a non-volatile integrated circuit memory device. The conductive interconnections may be electrically connected to drain regions of string selection transistors, respectively.

In some embodiments, the device may include a mold layer having a plurality of openings therein. Portions of respective ones of the conductive interconnections may extend through respective ones of the openings to contact a conductive pillar exposed thereby. A blocking dielectric pattern may be provided between the conductive interconnections and the mold layer. The blocking dielectric pattern may have an etch selectivity with respect to the mold layer.

BRIEF DESCRIPTION OF THE DRAWINGS

The inventive concept will become more apparent in view of the attached drawings and accompanying detailed description.

FIG. 13A is a plan view illustrating a semiconductor device according to yet other embodiments of the inventive concept;

DETAILED DESCRIPTION OF EMBODIMENTS

Figure 1A:
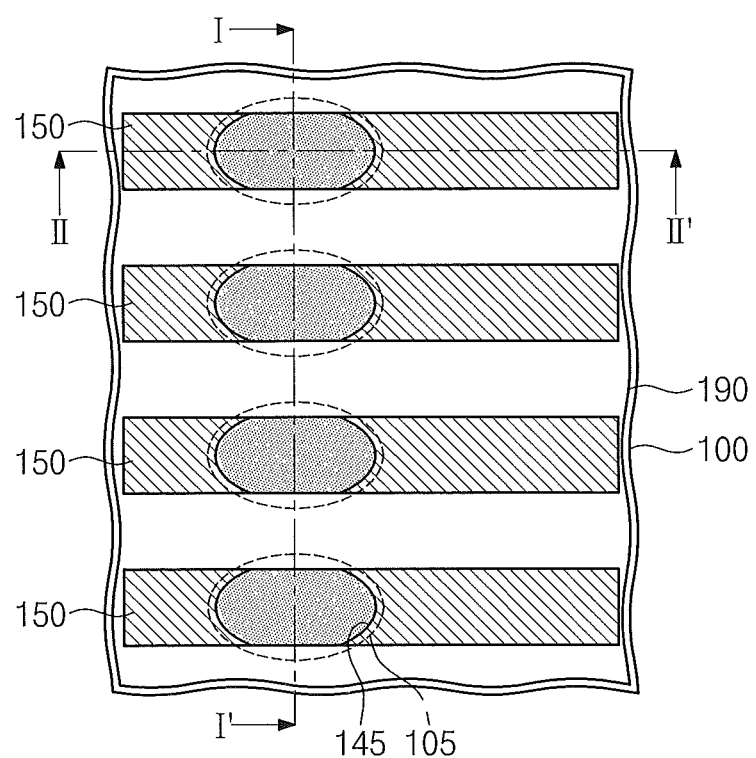
FIG. 1A is a plan view illustrating a semiconductor device according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, a semiconductor device according to some embodiments of the inventive concept will be described with reference to the drawings.

Figure 1B:
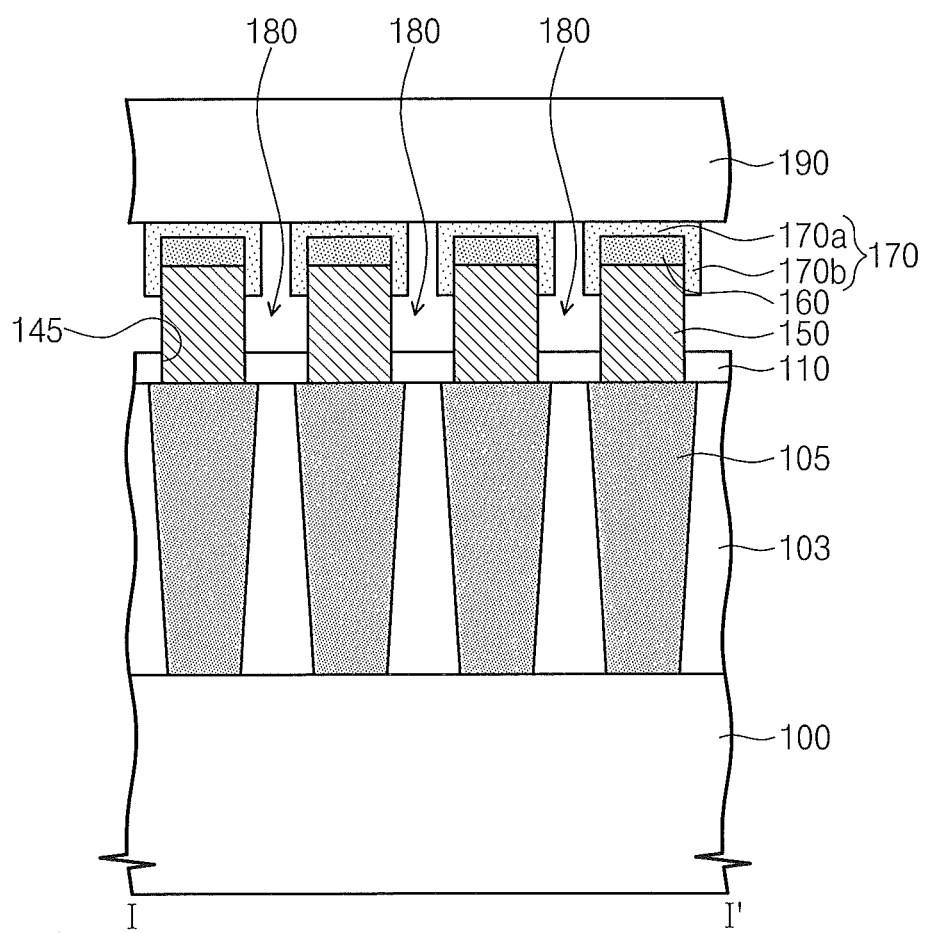
FIG. 1B is a cross-sectional view taken along a line I-I' of FIG. 1A.
Figure 1C:
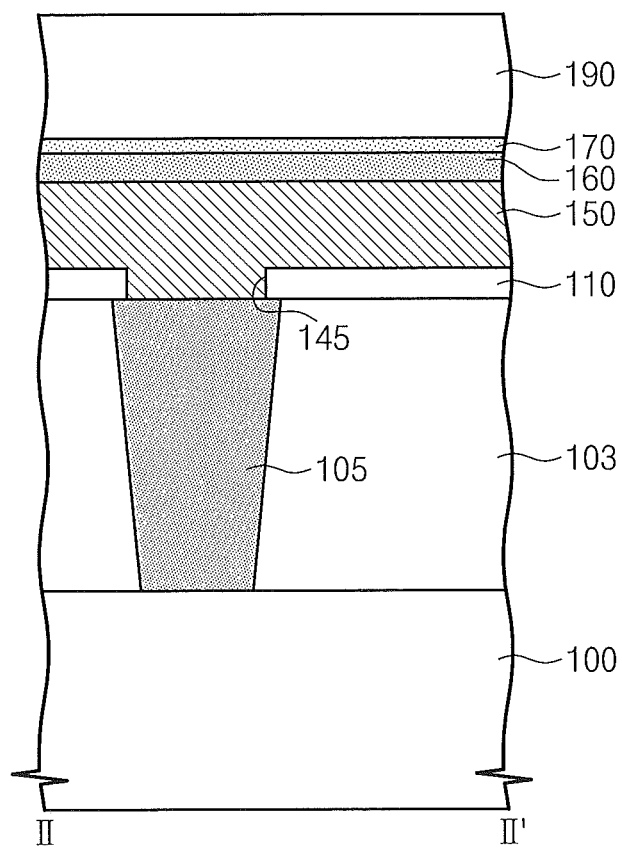
FIG. 1C is a cross-sectional view taken along a line II-II' of FIG. 1A.

FIG. 1A is a plan view illustrating a semiconductor device according to some embodiments of the inventive concept, FIG. 1B is a cross-sectional view taken along line I-I' of FIG. 1A, and FIG. 1C is a cross-sectional view taken along line II-II' of FIG. 1A.

Referring to FIGS. 1A to 1C, a lower interlayer dielectric layer 103 may be disposed on a substrate 100. The substrate 100 may be a semiconductor substrate, for example, a silicon substrate, a germanium substrate, or a silicon-germanium substrate. The lower interlayer dielectric layer 103 may be a single-layer or a multi-layer. The lower interlayer dielectric layer 103 may include oxide, nitride, and/or oxynitride.

A plurality of conductive pillars 105 may be disposed in the lower interlayer dielectric layer 103. The conductive pillars 105 may penetrate or extend through the lower interlayer dielectric layer 103 and may be spaced apart from each other in or along a y-axis direction. In some embodiments, the conductive pillars 105 may be arranged in the y-axis direction to constitute or define one column. As illustrated in FIG. 1A, top or upper surfaces of the conductive pillars 105 may have circular shapes or elliptical shapes. However, the inventive concept is not limited thereto, ant the top surfaces of the conductive pillars 105 may have various other shapes.

The conductive pillar 105 may include a conductive material. For example, the conductive pillar 105 may include at least one of a doped semiconductor (e.g., doped silicon), a metal (e.g., tungsten), a conductive metal nitride (e.g., titanium nitride, tantalum nitride), a transition metal (e.g., titanium, tantalum), and a conductive metal-semiconductor compound (e.g., metal silicide).

Interconnections 150 extending in or along an x-axis direction may be disposed on the lower interlayer dielectric layer 103. The interconnections 150 may extend substantially parallel to each other. The interconnections 150 may be spaced apart from each other along the y axis direction (e.g. in a direction substantially perpendicular to the x-axis direction). The x-axis and y-axis directions may be parallel to a top surface of the substrate 100.

A contact-mold layer 110 may also be disposed on the lower interlayer dielectric layer 103. In this case, the interconnections 150 may be disposed on the contact-mold layer 110. Each of the interconnections 150 may include a contact part that penetrates or extends through the contact-mold layer 110 and is in contact with a top surface of each of the conductive pillars 104. The contact part may include a bottom surface of the interconnection 150 and may extend through a contact hole 145 in the contact-mold layer 110 to directly contact the upper surface of the corresponding conductive pillar 104 therebelow. An interface may not exist between the contact part and the bottom surface of the interconnection 150. In other words, the contact part and the interconnection 150 may constitute or define a single body. In other embodiments, the contact-mold layer 110 may be omitted.

The interconnections 150 may include a conductive material. For example, the interconnections 150 may include a metal such as tungsten, aluminum, and/or copper.

The interconnections 150 may further include a barrier metal (e.g., titanium nitride, tantalum nitride) for minimizing diffusion of metal atoms. Additionally, the interconnections 150 may further include a glue layer such as a titanium layer and/or a tantalum layer.

Barrier dielectric patterns 160 may be disposed on the interconnections 150, respectively. The barrier dielectric patterns 160 may be disposed on the interconnections 150 and may be spaced apart from each other in or along the y-axis direction, respectively. In other words, the barrier dielectric patterns 160 may extend along the interconnections 150 in the x-axis direction and be spaced apart from each other in the y-axis direction. The barrier dielectric patterns 160 may include silicon nitride, metal (e.g., tantalum, titanium), metal nitride, and/or cobalt. The barrier dielectric patterns 160 may be confined to upper/top surfaces of the interconnections 150 such that the sidewalls of the interconnections 150 are free of the barrier dielectric patterns 160.

Spacers 170 may be respectively disposed on the interconnections 150 on which the barrier dielectric patterns 160 are respectively disposed. In other words, the spacers 170 may be disposed on the barrier dielectric patterns 160, respectively, such that the barrier dielectric patterns 160 are between the upper surfaces of the interconnections 150 and the spacers 170. In some embodiments, each of the spacers 170 may include a top surface portion 170a and sidewall portions 170b extending downward from both edges of the top surface portion 170a, respectively. The top surface portion 170a of the spacer 170 may be disposed to cover a top surface of the barrier dielectric pattern 160. The sidewall portions 170b of the spacer 170 may be disposed to cover both sidewalls of the barrier dielectric pattern 160 and portions of both sidewalls of the interconnections 150. In other words, the sidewalls portions 170b of the spacers 170 may extend from the barrier dielectric patterns 160 toward the substrate 100 beyond the top surfaces of the interconnections 150, such that a bottom surface of the sidewall portions 170b of the spacers 170 may be disposed at a level that is between the top surfaces and the bottom surfaces of the interconnections 150. Additionally, the bottom surface of the sidewall 170b of the spacer 170 may be disposed at a level higher than a bottom surface of the contact-mold layer 110. The spacers 170 may extend along the interconnections 150 in the x-axis direction and be spaced apart from each other in or along the y-axis direction. The spacers 170 may include a silicon compound (e.g., SiN, SiON, SiC, SiCN, SiO$_2$), a metal material (e.g., Ti, Ta), and/or a metal nitride (e.g., TiN, TaN).

An upper interlayer dielectric layer 190 may be disposed on the spacers 170. The upper interlayer dielectric layer 190 may define an upper boundary of respective air gaps 180 that are formed between the interconnections 150. In greater detail, each of the air gaps 180 may be disposed between a pair of the interconnections 150 that are adjacent one another. Each air gap 180 may define an elongated void or cavity or other unobstructed space between adjacent ones of the interconnections 150, and may be filled with air and/or another gaseous material in some embodiments. In some embodiments, the air gaps 180 may be surrounded by or may otherwise be defined by the upper interlayer dielectric layer 190, the spacers 170, the interconnections 150, and the contact-mold layer 110. The air gaps 180 may extend in parallel with the interconnections 150 and may electrically isolate adjacent ones of the interconnections 150. As such, the respective air gaps 180 may extend between sidewalls of the adjacent ones of the interconnections 150, that is, the air gap 180 may continuously extend from a sidewall of one interconnection to a sidewall of an adjacent interconnection.

In some embodiments, a top end or upper boundary of the air gap 180 may be disposed at substantially the same level as a top surface of the spacer 170 (i.e., a top surface of the top surface portion 170a).

The upper interlayer dielectric layer 190 may be a single-layer or a multi-layer. In some embodiments, the upper interlayer dielectric layer 190 may include oxide.

According to the semiconductor device described above, the air gaps 180 are disposed between the interconnections 150. A parasitic capacitance between the interconnections 150 adjacent to each other may be reduced or minimized due to the air gaps 180. Thus, it is possible to reduce or minimize a signal delay caused by the parasitic capacitance, so that the semiconductor device with excellent reliability may be realized.

Additionally, the semiconductor device according to the present embodiment may include the barrier dielectric patterns 160 that are disposed on the top surfaces of the interconnections 150 and are spaced apart from each other in the y-axis direction like the interconnections 150. In other words, since the barrier dielectric patterns 160 are formed on only the top surfaces of the interconnections 150 (that is, such that sidewalls of the interconnections 150 are free of the barrier dielectric patterns 160), hydrogen atoms, that may be included in interlayer dielectric layers disposed over and under the interconnections 150, may be easily exhausted. Thus, it is possible to reduce or minimize reliability deterioration of the semiconductor device that may be caused by the hydrogen atoms.

Moreover, the semiconductor device according to the present embodiment may further include the spacers 170 covering the interconnections 150 and the barrier dielectric patterns 160. Thus, the parasitic capacitance between the interconnections 150 may be more and more reduced. Additionally, since a distance between the interconnections 150 may be reduced by the spacers 170, flow or intrusion of the upper interlayer dielectric layer 190 into a space between the interconnections 150 may be reduced or minimized. Thus, reproducibility of the air gaps 180 may be improved. Moreover, since the parasitic capacitance is reduced or minimized due to the air gaps 180, the distance between the interconnections 150 may be reduced or minimized. As a result, highly integrated semiconductor devices may be realized.

The semiconductor device described above may be realized or implemented as a logic device, a semiconductor memory device, or a hybrid device including a logic device and a memory device.

Figure 2A:
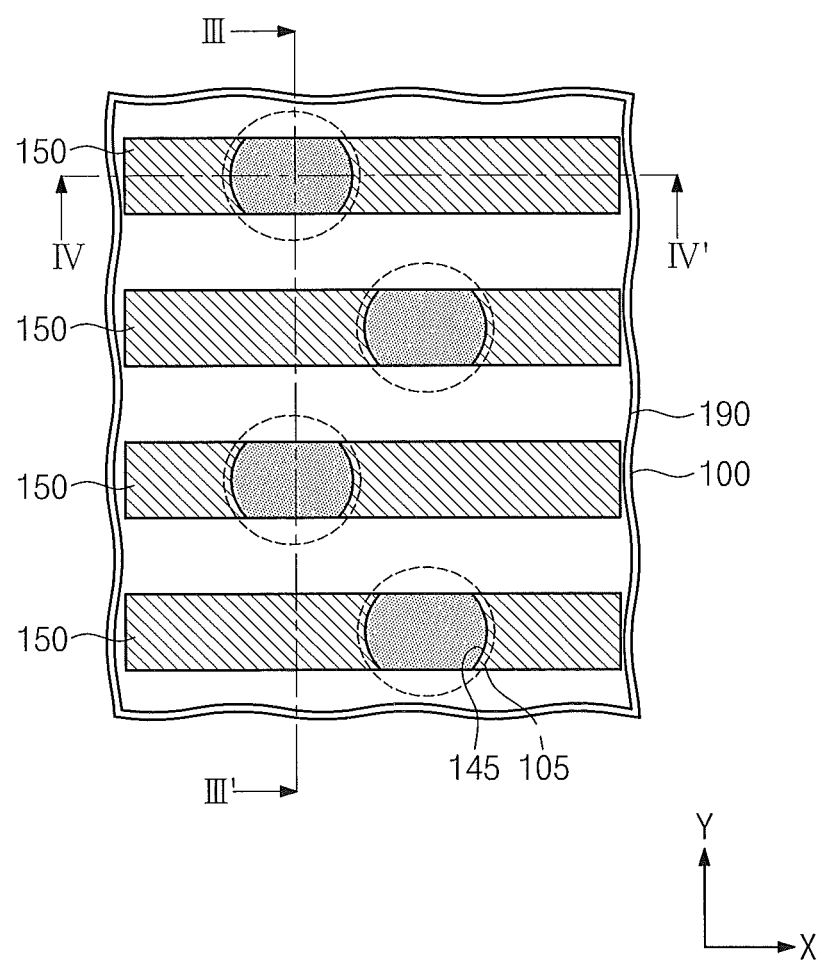
FIG. 2A is a plan view illustrating a semiconductor device according to other embodiments of the inventive concept.
Figure 2B:
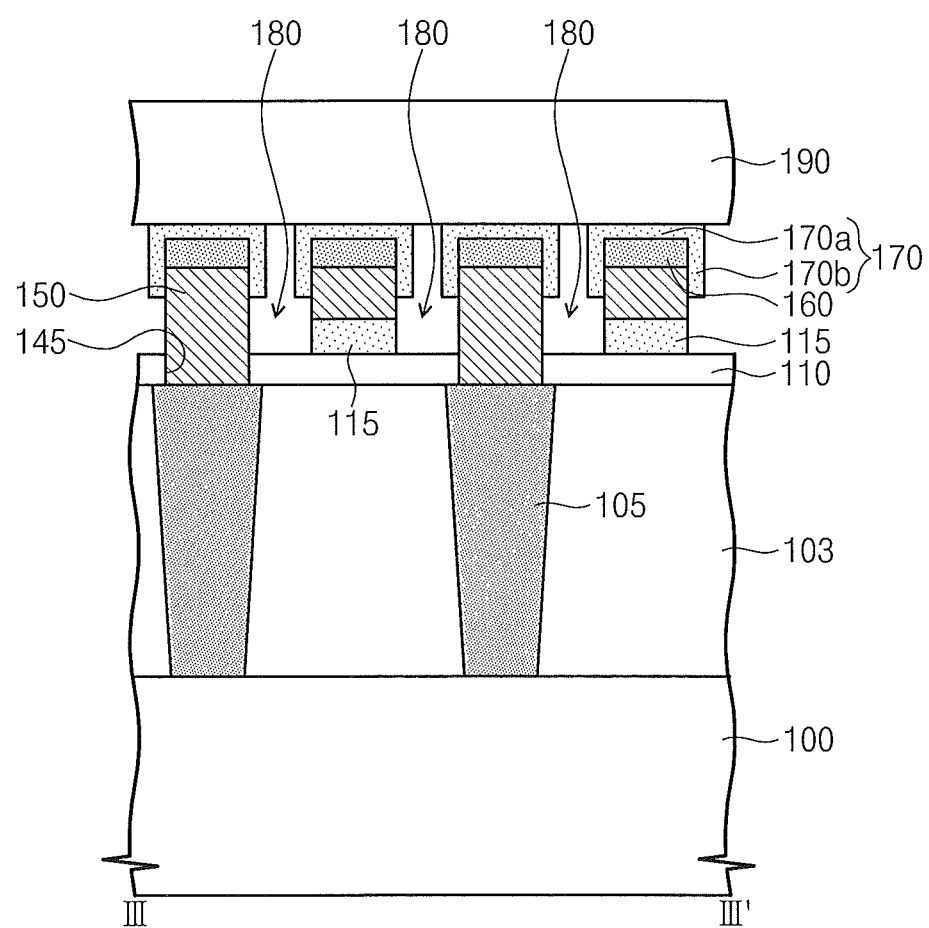
FIG. 2B is a cross-sectional view taken along a line of FIG. 2A.
Figure 2C:
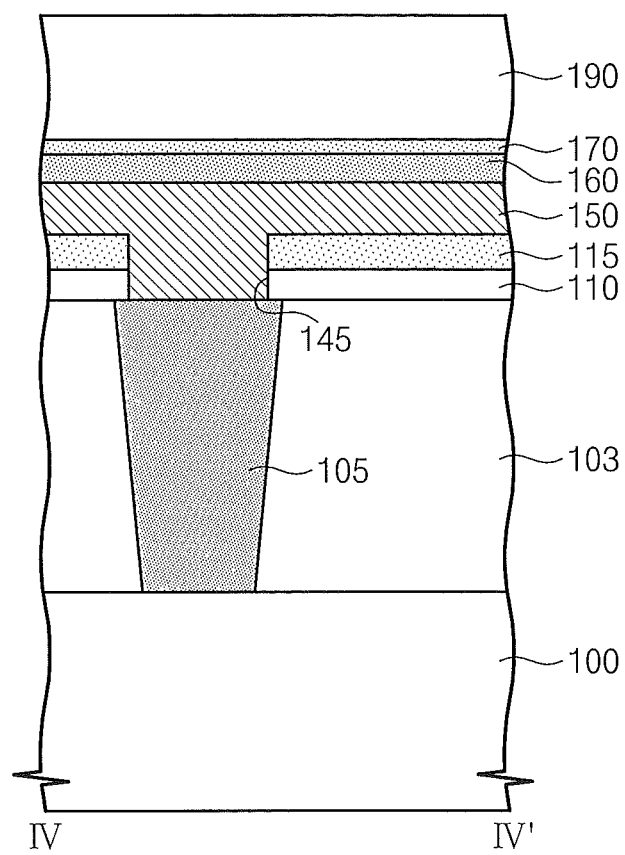
FIG. 2C is a cross-sectional view taken along a line IV-IV' of FIG. 2A.

FIG. 2A is a plan view illustrating a semiconductor device according to other embodiments of the inventive concept, FIG. 2B is a cross-sectional view taken along line III-III' of FIG. 2A, and FIG. 2C is a cross-sectional view taken along line IV-IV' of FIG. 2A.

In a semiconductor device as illustrated in FIGS. 2A to 2C, the substantially same elements as described in the embodiment illustrated in FIGS. 1A to 1C will be indicated by the same reference numerals or the same reference designators. For the purpose of ease and convenience in explanation, the descriptions of the same or similar elements as the embodiments illustrated in FIGS. 1A to 1C will be omitted or mentioned briefly.

Referring to FIGS. 2A to 2C, a lower interlayer dielectric layer 103 may be disposed on a substrate 100 and a contact-mold layer 110 may be disposed on the lower interlayer dielectric layer 103. Interconnections 150 extending substantially parallel to each other in or along the x-axis direction may be disposed on the contact-mold layer 110. The interconnections 150 may be spaced apart from each other in or along the y-axis direction that is substantially perpendicular to the x-axis direction. Each of the interconnections 150 may include a contact part. The contact part may extend downward (that is, toward the substrate 100) from a portion of the interconnection 150 so as to penetrate or extend through the contact-mold layer 110. A plurality of conductive pillars 105 may be disposed in the lower interlayer dielectric layer 103. The conductive pillars 105 may penetrate or extend through the lower interlayer dielectric layer 103 and may be spaced apart from each other along the y-axis direction. The contact parts of the interconnections 150 may penetrate the contact-mold layer 110 so as to be in direct contact with top surfaces of the conductive pillars 105, respectively.

In some embodiments, as illustrated in FIG. 2A, the conductive pillars 105 connected to odd-numbered interconnections may be arranged in or along the y-axis direction to constitute or define a first column. The conductive pillar 105 connected to even-numbered interconnections may be arranged in the y-axis direction to constitute or define a second column disposed at a side of the first column. Since the odd-numbered and even-numbered interconnections 150 may extend in parallel to each other in or along the x-axis direction, the conductive pillars 105 may not be overlapped with each other in the x-axis direction.

In some embodiments, as illustrated in FIG. 2A, the conductive pillars 105 may be arranged in a zigzag-shape in or along the y-axis direction. In other words, the conductive pillars 105 may be classified into a first group constituting the first column and a second group constituting the second column and may be arranged in the zigzag-shape in the y-axis direction.

A blocking dielectric pattern 115 may be disposed between the interconnection 150 and the contact-mold layer 110. In some embodiments, the blocking dielectric pattern 115 may be disposed under the bottom surface of the interconnection 150 except for the contact part. The blocking dielectric pattern 115 may include a dielectric material having an etch selectivity with respect to the contact-mold layer 110. The blocking dielectric patterns 115 may function as an etch stop layer when a contact hole 145 for the contact part of the interconnection 150 is formed in the contact-mold layer 110. In other embodiments, the blocking dielectric pattern 115 may be omitted.

Barrier dielectric patterns 160 may be disposed on the interconnections 150, respectively. The barrier dielectric patterns 160 may be disposed on the top surfaces of the interconnections 150 and spaced apart from each other in the y-axis direction, respectively. In other words, the barrier dielectric patterns 160 may extend along the interconnections 150 in the x-axis direction and be spaced apart from each other in the y-axis direction. Sidewalls of the interconnections 150 may be substantially free of the barrier dielectric patterns 160.

Spacers 170 may be disposed on the interconnections 150 with the barrier dielectric pattern 160 therebetween, respectively. In some embodiments, each of the spacers 170 may include a top surface portion 170a and sidewall portions 170b extending downward (that is, toward the substrate 100) from edges of the top surface portion 170a, respectively. The top surface portion 170a of the spacer 170 may be disposed to cover a top surface of the barrier dielectric pattern 160. The sidewall portions 170b of the spacer 170 may be disposed to cover both sidewalls of the barrier dielectric pattern 160 and portions of both sidewalls of the interconnection 150. In other words, the sidewalls portion 170b of the spacers 170 may extend from the barrier dielectric pattern 160 toward the substrate 100 beyond the top surface of the interconnection 150, such that a bottom surface of the sidewall portion 170b of the spacer 170 may be disposed at a level between the top surface and the bottom surface of the interconnection 150. Additionally, the bottom surface of the sidewall portion 170b of the spacer 170 may be disposed at a level higher than a bottom surface of the contact-mold layer 110. The spacers 170 may extend along the interconnections 150 in the x-axis direction and be spaced apart from each other in the y-axis direction.

An upper interlayer dielectric layer 190 may be disposed on the spacers 170. The upper interlayer dielectric layer 190 may define a boundary of air gaps 180 that may be formed between the interconnections 150. In more detail, each of the air gaps 180 may be disposed between a pair of the interconnections 150 that are adjacent one another. In some embodiments, the air gaps 180 may be surrounded or otherwise defined by the upper interlayer dielectric layer 190, the spacers 170, the interconnections 150, and the contact-mold layer 110. The air gaps 180 may define elongated voids/cavities/unobstructed spaces that extend substantially in parallel with the interconnections 150 and electrically isolate adjacent ones of the interconnections 150. In some embodiments, a top end or upper boundary of the air gap 180 may be disposed at substantially the same level as the top surface of the spacer 170.

Next, methods of fabricating a semiconductor device according to some embodiments will be described with reference to the drawings. In particular, FIGS. 3 to 11 are cross-sectional views taken along line I-I' of FIG. 1A to illustrate methods of fabricating a semiconductor device according to some embodiments of the inventive concept.

Figure 3:
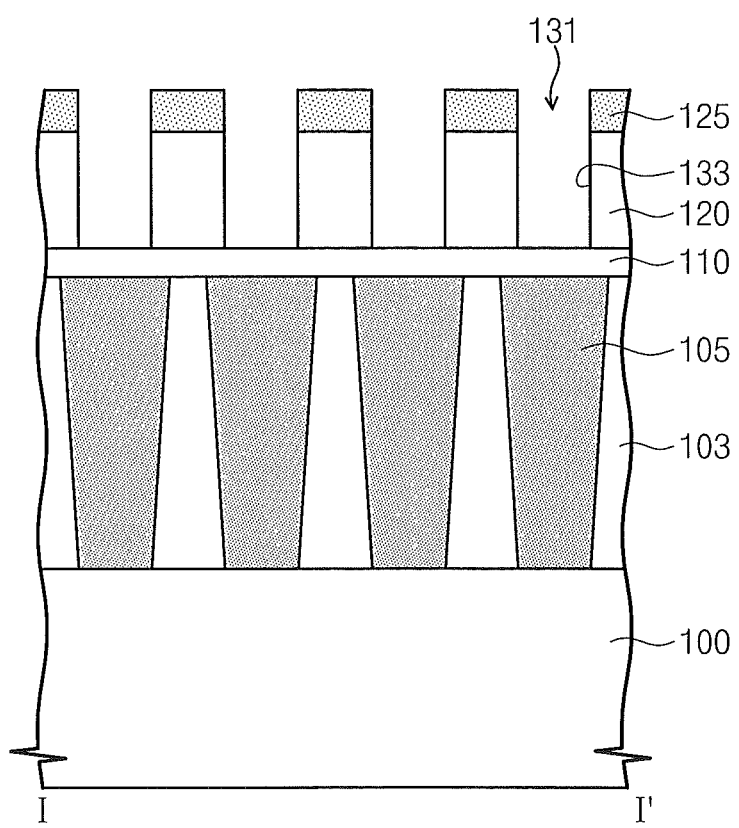
FIGS. 3 to 11 are cross-sectional views taken along a line I-I' of FIG. 1A to illustrate methods of fabricating a semiconductor device according to some embodiments of the inventive concept.

Referring to FIG. 3, a lower interlayer dielectric layer 103 may be formed on a substrate 100 and conductive pillars 105 may be formed to penetrate or extend through the lower interlayer dielectric layer 103. In some embodiments, the conductive pillars 105 may be arranged in or along the y-axis direction of FIG. 1A to constitute or define one column. Top surfaces of the conductive pillars 105 may be substantially coplanar with a top surface of the lower interlayer dielectric layer 103.

A contact-mold layer 110 and an interconnection-mold layer 120 may be sequentially formed on the substrate 100. The contact-mold layer 110 and the interconnection-mold layer 120 may include an oxide. Mask patterns 125 extending in parallel to each other in a first direction (e.g., the x-axis direction of FIG. 1A) may be formed on the interconnection-mold layer 120. For example, forming the mask patterns 125 may include forming a mask layer on the interconnection-mold layer 120, and patterning the mask layer to form the mask patterns 125. First openings 131 may be defined by the mask patterns 125. Each of the first openings 131 may be defined between the mask patterns 125 that are adjacent one another and extend in parallel with the mask patterns 125. The first openings 131 may be formed simultaneously with the mask patterns 125. The interconnection-mold layer 120 may be etched using the mask patterns 125 as etch masks to form trenches or grooves 133 in the interconnection-mold layer 120. The grooves 133 may extend in parallel with the mask patterns 125. The contact-mold layer 110 under the grooves 133 may remain.

Figure 4:
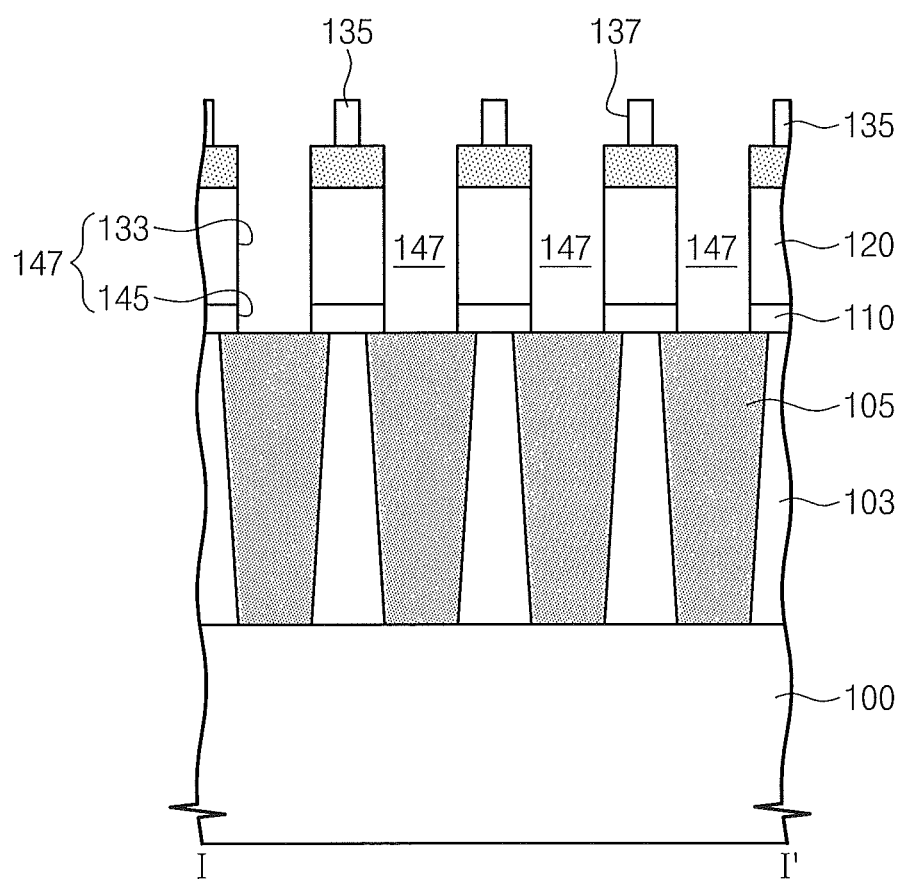

Referring to FIG. 4, a second mask layer 135 having second openings 137 may be formed on the substrate 100 having the grooves 133. Each of the second openings 137 may have a cylindrical or hole-shape. Each of the second openings 137 may expose a portion of a bottom surface of each of the grooves 133. A width of the second opening 137 may be greater than a width of the groove 133. The remaining contact-mold layer 110 under the grooves 133 may be etched using the second mask layer 135 and the mask patterns 125 as etch masks to form contact holes 145 extending through the contact-mold layer 110 and exposing the upper surfaces of the conductive pillars 105. Due to the second mask layer 135 and the mask patterns 125, each of the contact holes 145 may have both sidewalls aligned with both sidewalls of each of the grooves 133, respectively. In other embodiments, even though not shown in the drawings, if a blocking dielectric layer (such as the blocking dielectric layer 115 shown in FIGS. 2B-2C) is formed between the contact-mold layer 110 and the interconnection-mold layer 120, the interconnection-mold layer 120 may be etched using the mask patterns 125 as etch masks and using the blocking dielectric layer as an etch stop layer, and then the blocking dielectric layer and then the contact-mold layer 110 may be etched using the second mask layer 135 and the mask patterns 125 as etch mask. Thus, recess regions 147 may be formed.

Figure 5:
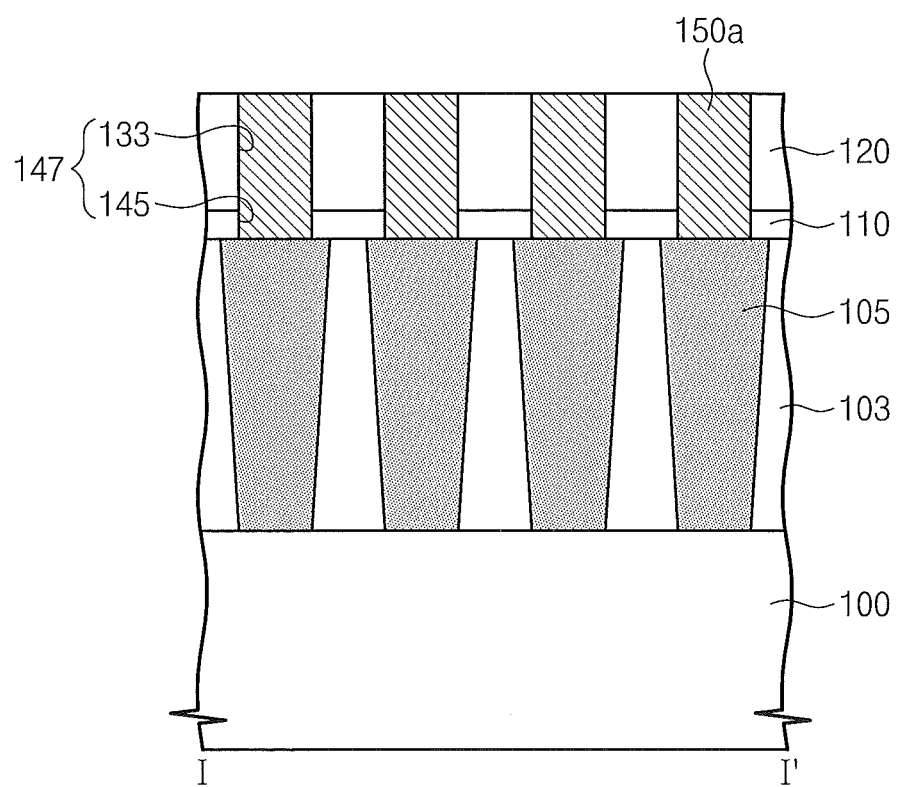

Referring to FIG. 5, after the second mask layer 135 and the mask patterns 125 are removed, a conductive layer may be formed on the substrate 100 so as to substantially fill the recess regions 147. The conductive layer may include a metal such as tungsten, aluminum, and/or copper. Additionally, the conductive layer may further include a barrier metal (e.g., titanium nitride, tantalum nitride) for reducing or minimizing diffusion of metal atoms. Moreover, the conductive layer may further include a glue layer, such as a titanium layer and/or a tantalum layer. The conductive layer may be planarized until the interconnection-mold layer 120 is exposed. Thus, conductive patterns 150a may be formed in the recess regions 147, respectively. The conductive layer may be planarized by a chemical mechanical polishing (CMP) process. The conductive patterns 150a may extend along the recess regions 147 in the first direction.

Alternatively, the conductive layer may be formed in the state where the mask patterns 125 remain (that is, prior to removal of the mask patterns 125). In this case, when the conductive layer is planarized, the mask patterns 125 may be removed.

Figure 6:
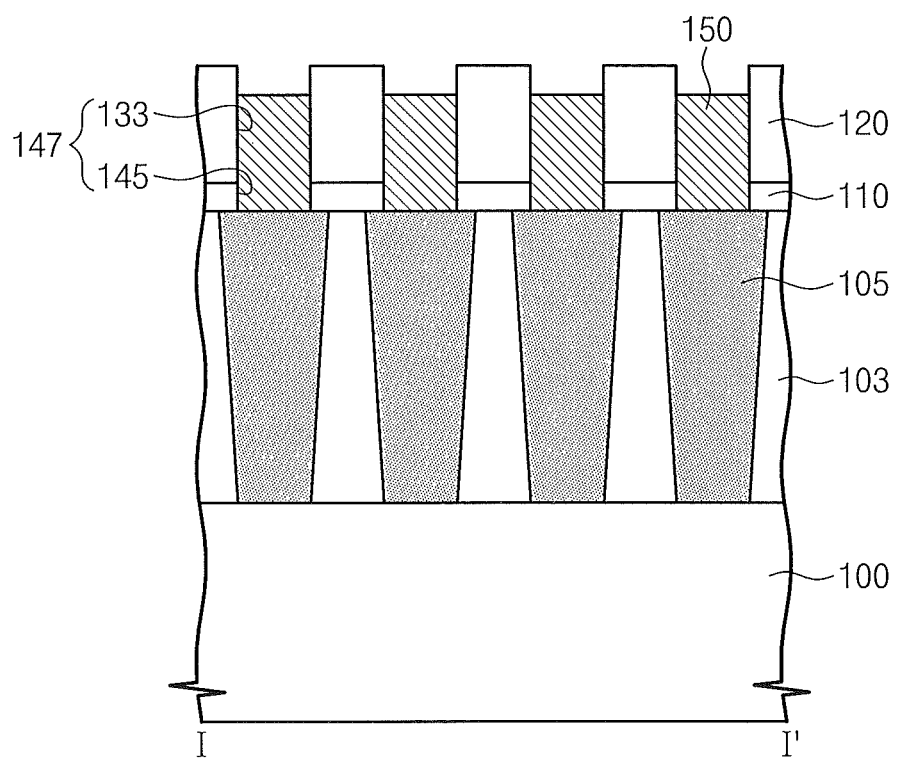

Referring to FIG. 6, the conductive patterns 150a in the recess regions 147 may be partially etched to form conductive interconnections 150. Top surfaces of the conductive interconnections 150 may be formed to be lower than the top surface of the interconnection-mold layer 120 by the etching process. The top surfaces of the interconnections 150 may be formed at various heights or thicknesses according to embodiments described herein and are not limited to the heights/thicknesses shown.

Figure 7:
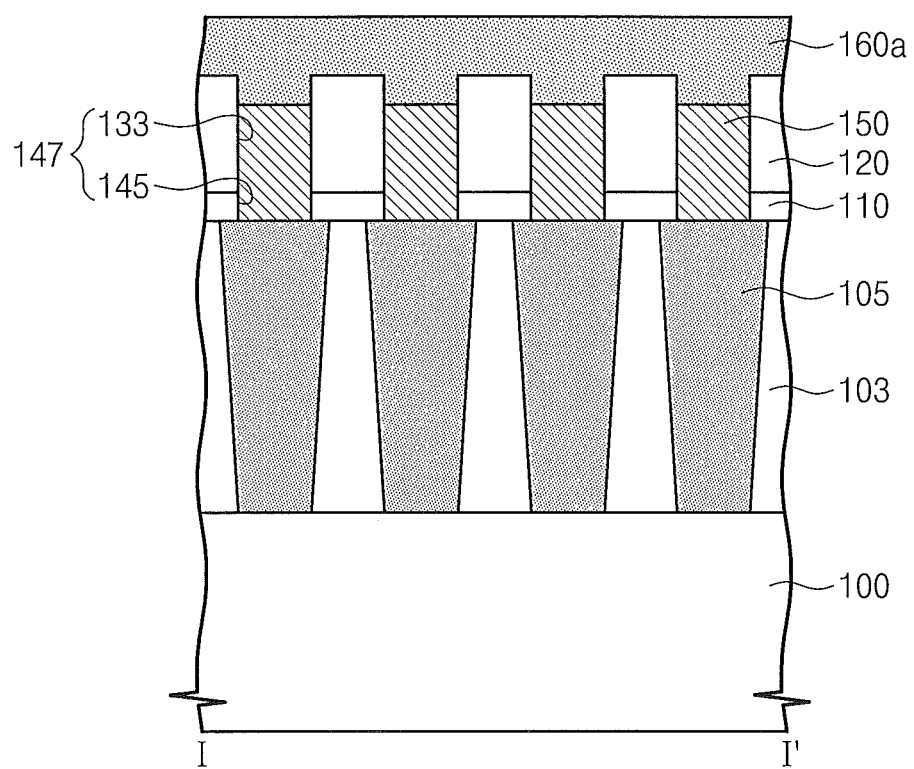

Referring to FIG. 7, a barrier dielectric layer 160a may be formed on the substrate having the interconnections 150. The barrier dielectric layer 160a may be formed using a deposition process. The barrier dielectric layer 160a may include a material having an etch selectivity with respect to the interconnection-mold layer 120. For example, the barrier dielectric layer 160a may be formed of a silicon nitride layer or a metal nitride layer.

Figure 8:
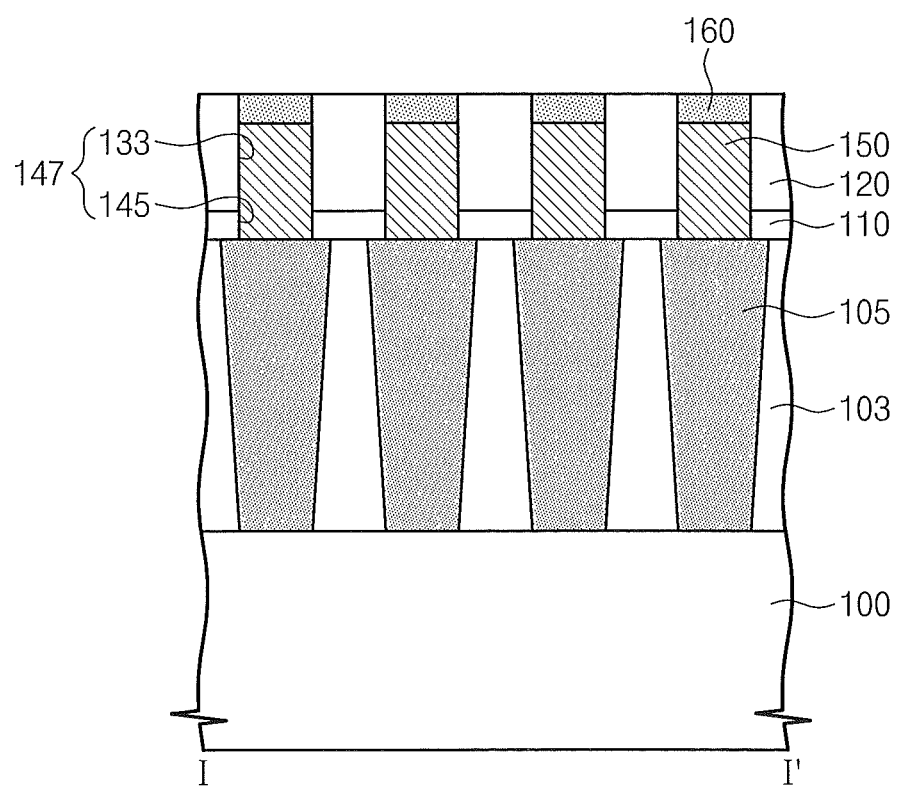

As illustrated in FIG. 8, the barrier dielectric layer 160a may be planarized until the interconnection-mold layer 120 is exposed, so that barrier dielectric patterns 160 may be formed. Top surfaces of the barrier dielectric patterns 160 may be substantially coplanar with the top surface of the interconnection-mold layer 120. The planarization process of the barrier dielectric layer 160a may be performed using a CMP process. Thus, each of the barrier dielectric patterns 160 may be formed on only each of the top surfaces of the interconnections 150, such that sidewalls of the interconnections are free of the barrier dielectric patterns 160. In other words, the barrier dielectric patterns 160 may extend along the interconnections 150 in the first direction and may be spaced apart from a second direction (e.g., the y-axis direction of FIG. 1A) perpendicular to the first direction.

Since the barrier dielectric patterns 160 are formed on only the top surfaces of the interconnections 150, hydrogen atoms included in the interconnections 150 or interlayer dielectric layers over and under the interconnections 150 may be easily exhausted. Thus, it is possible to reduce or minimize reliability deterioration of the semiconductor device that may be caused by the hydrogen atoms.

Figure 9:
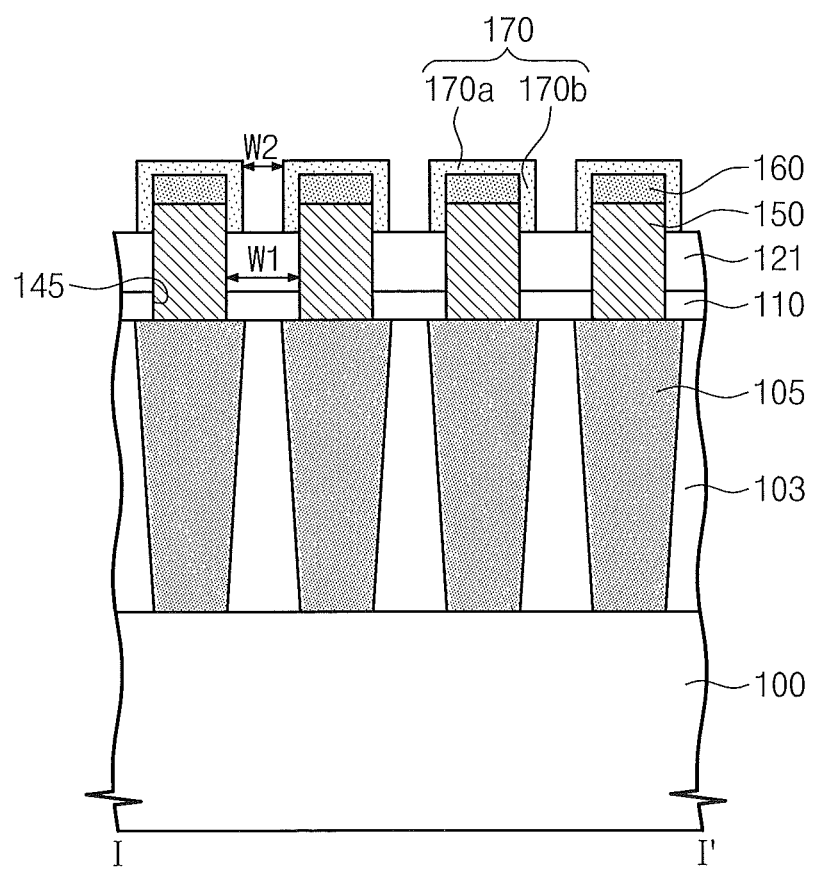

Referring to FIG. 9, the interconnection-mold layer 120 may be etched. The interconnection-mold layer 120 may be etched, using an etchant that provides etch selectivity with respect to the barrier dielectric pattern 160. The interconnection-mold layer 120 may be fully or partially removed by the etching process.

In some embodiments, the interconnection-mold layer 120 may be partially etched, such that a height of the interconnection-mold layer 120 may be lowered. In other embodiments, the interconnection-mold layer 120 may be completely etched to be removed. In this case, the contact-mold layer 110 may be used as an etch stop layer. In other words, the interconnection-mold layer 120 may be completely removed in some embodiments. Or, the interconnection-mold layer 120 may be partially etched, so that a portion of the interconnection-mold layer 120 may remain in some embodiments. If the interconnection-mold layer 120 may be partially etched, a height of the remaining portion of the interconnection-mold layer 120 may be variously controlled. Meanwhile, as illustrated in FIG. 9, when the interconnection-mold layer 120 may be partially etched, a top surface of the etched interconnection-mold layer 120 may be lower than the top surface of the interconnection 150.

Subsequently, spacers 170 may be formed on and/or covering the barrier dielectric patterns 160 and the interconnections 150. Since the spacers 170 may cover the barrier dielectric patterns 160 and the interconnections 150, the spacers 170 may extend in the first direction and be spaced apart from each other in the second direction. The spacers 170 may include a silicon compound (e.g., SiN, SiON, SiC, SiCN, $SiO_2$), a metal material (e.g., Ti, Ta), or a metal nitride (e.g., TiN, TaN).

In some embodiments, each of the spacers 170 may include a top surface portion 170a and sidewall portions 170b vertically and downwardly extending toward the substrate 100 from edges of the top surface portion 170a. The top surface portion 170a of the spacer 170 may be disposed to cover a top surface of the barrier dielectric pattern 160. The sidewall portions 170b of the spacer 170 may be disposed to cover both sidewalls of the barrier dielectric pattern 160 and portions of both sidewalls of the interconnection 150. A vertical length of the sidewall portion 170b of the spacer 170 may be defined by the height of the interconnection-mold layer 120. In other words, the vertical length of the sidewall portion 170b of the spacer 170 may be variously controlled by controlling the height of the interconnection-mold layer 120.

In other embodiments, the top surface portion 170a of the spacer 170 may be removed by a spacer-etching process. For example, if the spacers 170 may include a material difficult to diffuse hydrogen atoms (e.g., silicon, nitride or metal nitride), the top surface portion 170a may be removed, so that the spacer 170 may be formed to have only the sidewall portions 170b.

Due to the formation of the spacers 170, a distance W2 between upper regions of the interconnections 150 may be smaller than a distance W1 between lower regions of the interconnections 150.

Figure 10:
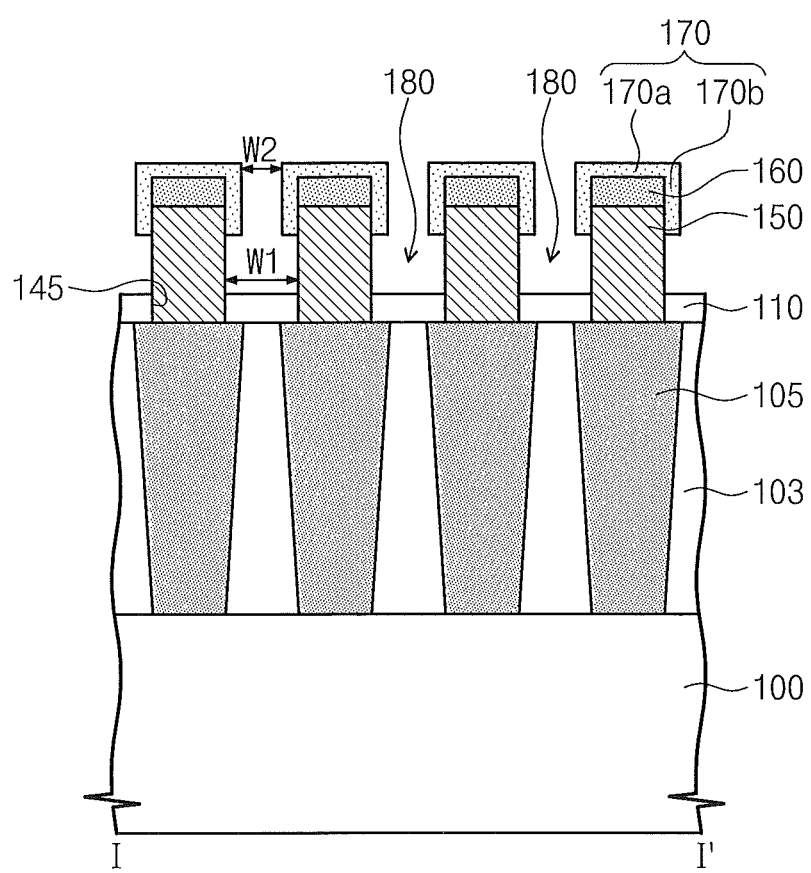

Referring to FIG. 10, the interconnection-mold layer 120 may be removed. The removal of the interconnection-mold layer 120 may be performed using a dry and/or wet etching process. Since the interconnection-mold layer 120 is removed, empty regions or unobstructed spaces 180a may be formed between the interconnections 150. At this time, the contact-mold layer 110 may also be removed. In other embodiments, the process for removing the contact-mold layer 110 may be omitted such that the contact-mold layer 110 may remain.

Figure 11:
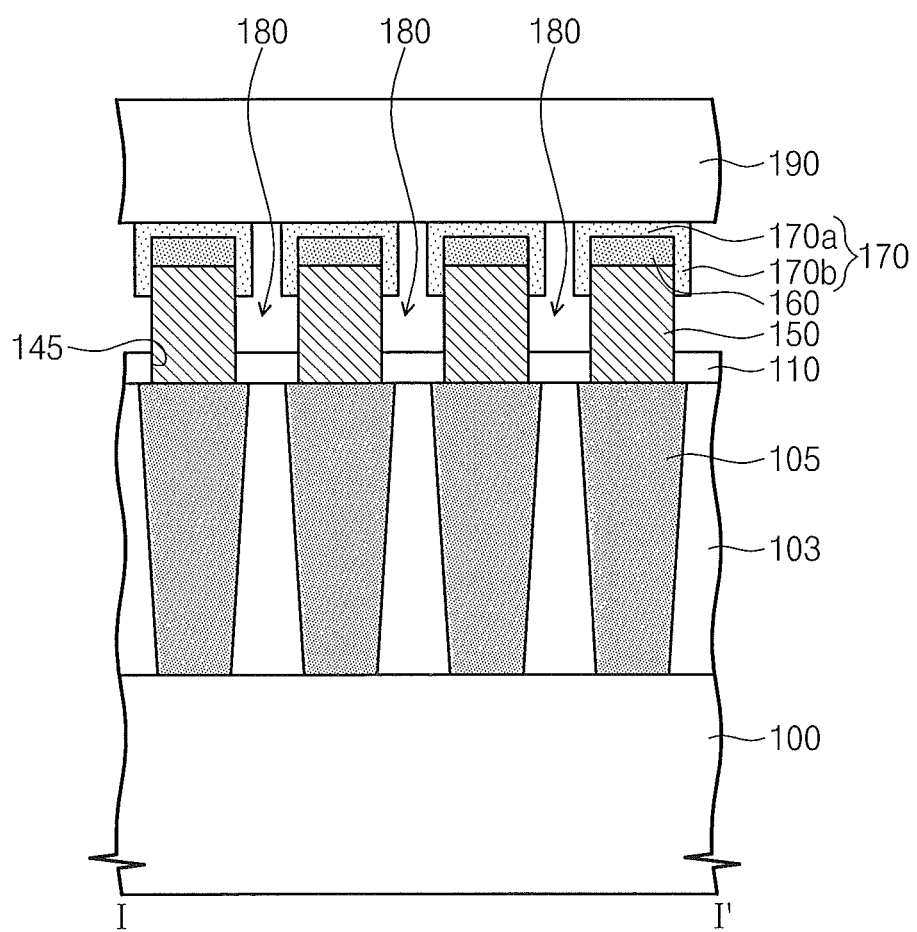

Referring to FIG. 11, an upper interlayer dielectric layer 190 may be formed on the interconnections 150 including the barrier dielectric patterns 160 and the spacers 170 thereon. Accordingly, respective air gaps 180 may be defined between adjacent ones of the interconnections 150. For example, the upper interlayer dielectric layer 190 with poor conformality may be deposited, such that the air gaps 180 may be formed between the interconnections 150. A size of the air gap 180 may be controlled by changing a deposition thickness of the spacer 170.

In some embodiments, the upper interlayer dielectric layer 190 may be formed by a chemical vapor deposition (CVD) process. The CVD process for the upper interlayer dielectric layer 190 may use thermal energy, plasma energy, or thermal/plasma energy. The upper interlayer dielectric layer 190 may be formed by a single CVD process. Alternatively, the upper interlayer dielectric layer 190 may be formed by a multi-CVD process. The upper interlayer dielectric layer 190 may include an atomic layer deposition (ALD) oxide, an oxide formed by a TEOS-CVD process using the plasma, and/or an oxide formed by a high-temperature CVD process.

As described with reference to FIG. 10, if the upper interlayer dielectric layer 190 is formed on the interconnections 150 on which the spacers 170 are formed, the distance W2 between the upper regions of the interconnections 150 may be narrower. Thus, it is possible to reduce and/or prevent the upper interlayer dielectric layer 190 from inflowing or otherwise intruding into a space between the interconnections 150. As a result, the air gap 180 may be surrounded or bounded by the upper interlayer dielectric layer 190, the spacers 170, the interconnections 150, and the contact-mold layer 110. As such, the reproducibility of the formation of the air gap 180 may be improved. Also, sidewalls of the interconnections may be free of the upper dielectric layer 190 and/or other insulating layers (other than the spacers 170) in some embodiments. Since the air gaps 180 are formed between the interconnections 150, the parasitic capacitance between the interconnections 150 may be reduced or minimized, such that the semiconductor device with excellent reliability may be realized. Additionally, since the parasitic capacitance is reduced or minimized by the air gaps 180, it is possible to reduce or minimize a distance between the interconnections 150. As a result, the highly integrated semiconductor device may be realized.

Figure 12A:
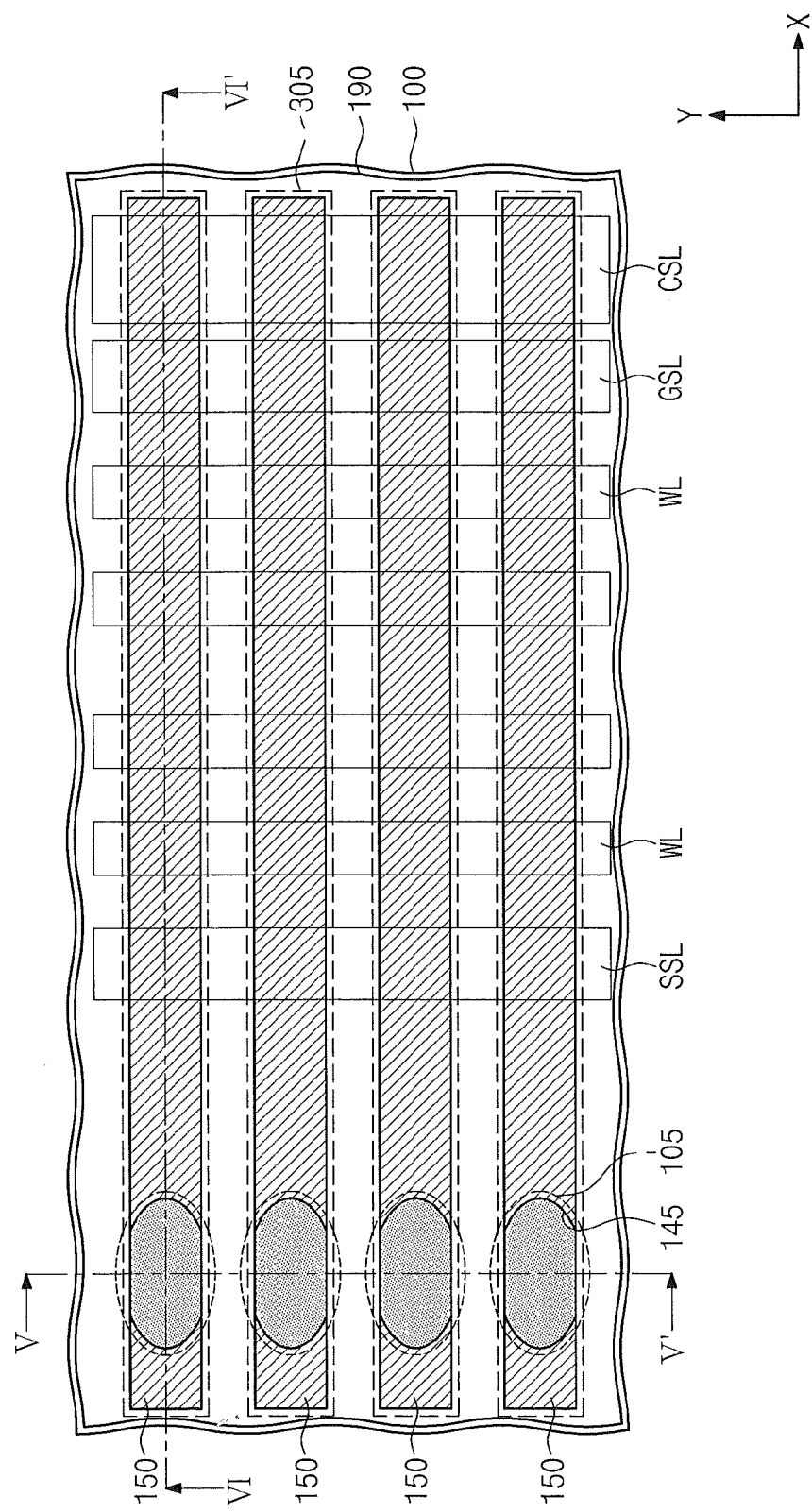
FIG. 12A is a plan view illustrating a semiconductor device according to still other embodiments of the inventive concept.
Figure 12B:
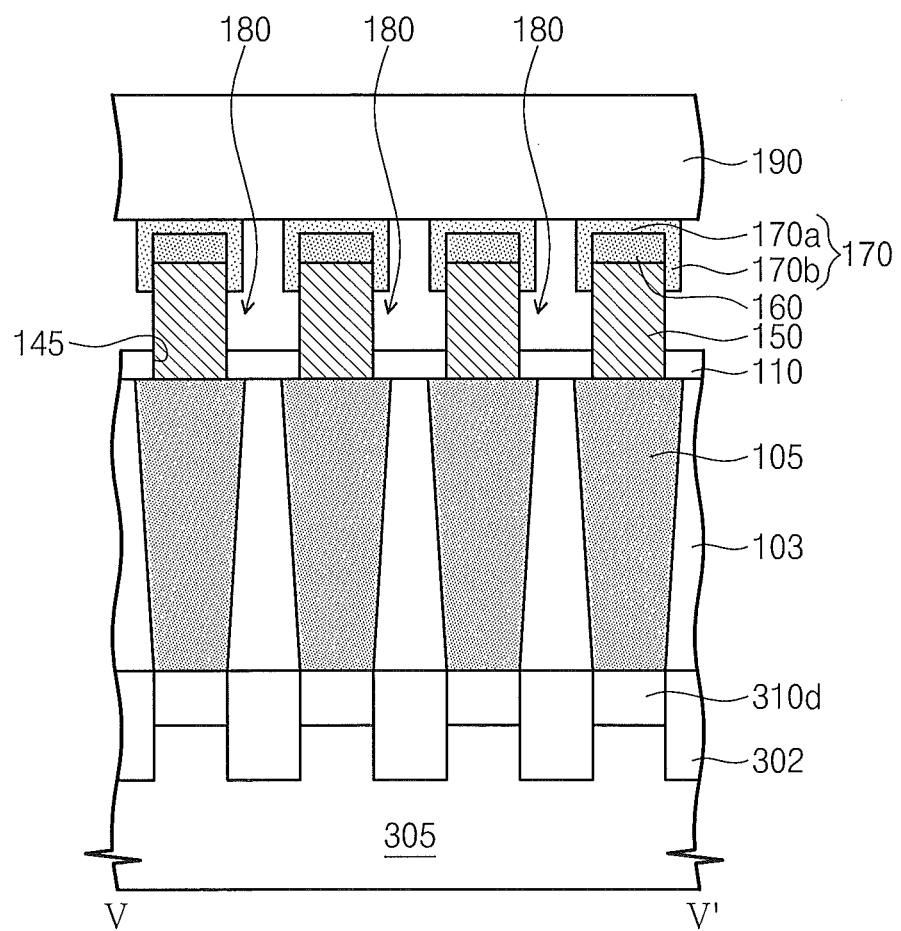
FIG. 12B is a cross-sectional view taken along a line V-V' of FIG. 12A.
Figure 12C:
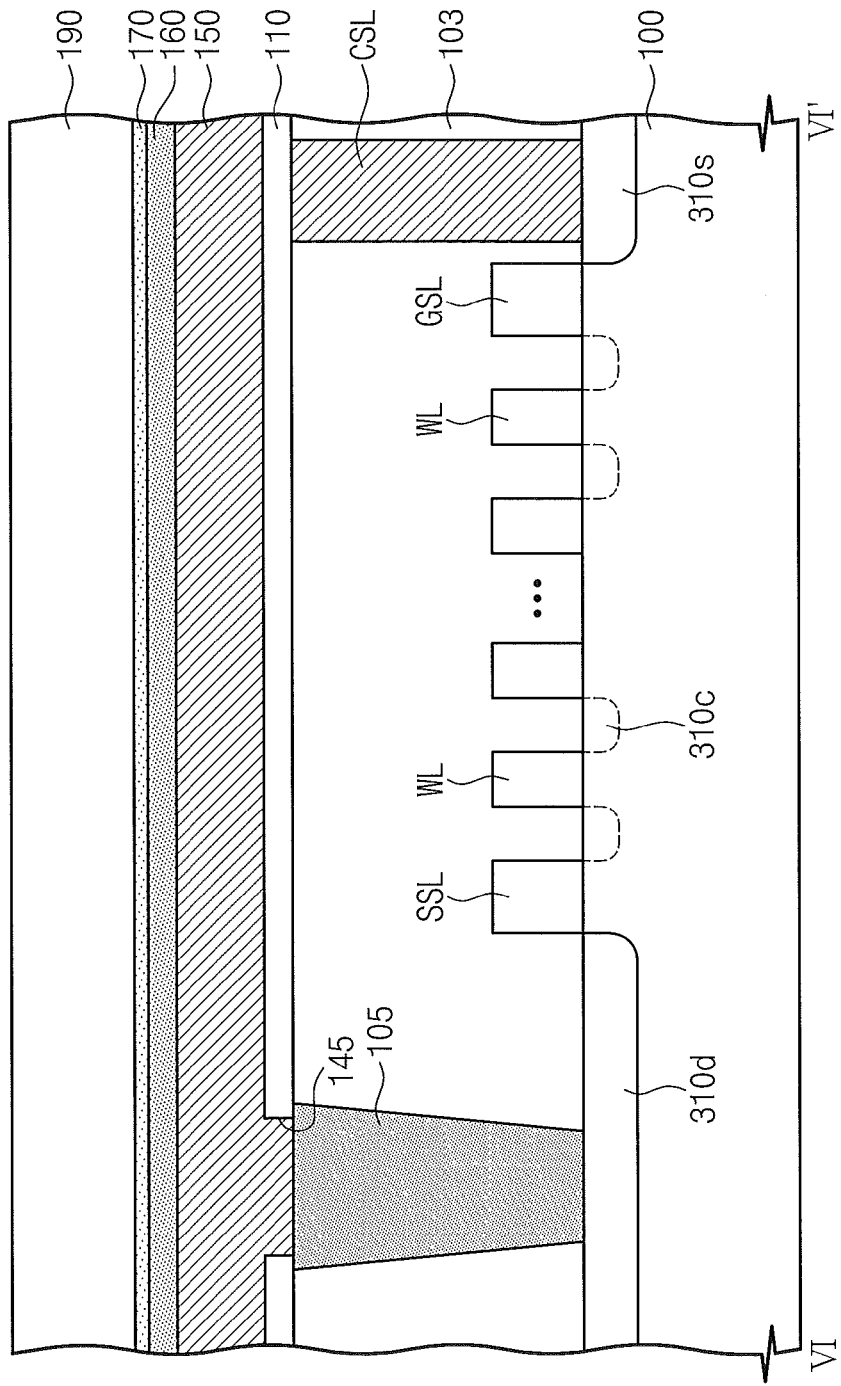
FIG. 12C is a cross-sectional view taken along a line VI-VI' of FIG. 12A.

FIG. 12A is a plan view illustrating a semiconductor device according to still other embodiments of the inventive concept, FIG. 12B is a cross-sectional view taken along line V-V' of FIG. 12A, and FIG. 12C is a cross-sectional view taken along line VI-VI' of FIG. 12A. The present embodiment represents a semiconductor memory device including the interconnection structure illustrated in the embodiments described above. The same or similar elements in the embodiments previously described will be indicated by the same reference numerals or the same reference designators.

Referring to FIGS. 12A to 12C, a device isolation pattern 302 may be disposed on a substrate 100 to define active portions 305. The active portion 305 may correspond to a portion of the substrate 100 surrounded by the device isolation pattern 302. The active portions 305 may extend in a first direction in parallel to each other. The active portions 305 may be spaced apart from each other in a second direction perpendicular to the first direction. The first direction may correspond to an x-axis direction of FIG. 12A and the second direction may correspond to a y-axis direction of FIG. 12A. The active portions 305 may be doped with dopants of a first conductivity type.

A string selection line SSL and a ground selection line GSL may extend in the second direction so as to cross over the active portions 305. A plurality of word lines WL may be disposed between the string and ground selection lines SSL and GSL. The word lines WL may extend in the second direction so as to cross over the active portions 305. A common drain 310d may be disposed in each of the active portions 305 at a side of or adjacent the string selection line SSL, and a common source 310s may be disposed in each of the active portions 305 at a side of or adjacent the ground selection line GSL. The string selection line SSL, the word lines WL, and the ground selection line GSL may be disposed between the common drain 310d and the common source 310s. Cell source/drains 310c may be disposed in the active portion 305 at both sides of the word line WL. The common drain 310d and the common source 310s may be doped with dopants of a second conductivity type different from the first conductivity type. The cell source/drains 310c may be doped with dopants of the second conductivity type. Alternatively, the cell source/drains 310c may not be doped with dopants (e.g., may be undoped). In other words, the cell source/drains 310c may have the same doped state as a channel region under the word line WL. In this case, the cell source/drains 310c may correspond to inversion layers generated by a fringe field of the word line WL when an operation voltage is applied to the word line WL.

For example, each of the word lines WL may include a tunnel dielectric layer, a charge storing layer, a blocking dielectric layer, and a control gate that are sequentially stacked on the active portion 305. The charge storing layer may be a floating gate formed of a semiconductor material. Alternatively, the charge storing layer may be a dielectric layer (e.g., a nitride layer) having traps capable of storing charges. The blocking dielectric layer may include a high-k dielectric material (e.g., hafnium oxide, aluminum oxide) having a dielectric constant higher than that of the tunnel dielectric layer. The blocking dielectric layer may be a single layer or a multi-layer. The tunnel dielectric layer may include a single layer or a multi-layer. The tunnel dielectric layer may include a thermal oxide layer.

The string selection line SSL may include a string selection gate crossing over the active portion 305 and a first gate dielectric layer disposed between the string selection gate and the active portion 305. The ground selection line GSL may include a ground selection gate crossing over the active portion 305 and a second gate dielectric layer disposed between the ground selection gate and the active portion 305.

A cell transistor may include each of the word lines WL and the cell source/drains 310c disposed at both sides of each of the word lines WL. A string selection transistor may include the string selection line SSL, and the common drain 310d and the cell source/drain 310c respectively disposed at both sides of the string selection line SSL. A ground selection transistor may include the ground selection line GSL, and the common source 310s and the cell source/drain 310c respectively disposed at both sides of the ground selection line GSL. A memory cell string may be provided on each of the active portions 305. The cell string may include the string selection transistor, the ground selection transistor, and a plurality of the cell transistors connected in series to each other. The string selection transistor may be connected in series to one end of the plurality of cell transistors and the ground selection transistor may be connected in series to another end of the plurality of cell transistors. The string selection, cell, and ground selection transistors in the cell string according to the present embodiment may be horizontally arranged on the substrate 100.

A lower interlayer dielectric layer 103 may be disposed on an entire surface of the substrate 100 having the lines SSL, WL, and GSL. A common source line CSL may be disposed in the lower interlayer dielectric layer 103 and extend in the second direction. The common source line CSL may be connected to the common sources 310s formed in the active portions 305.

Conductive pillars 105 may penetrate or extend through the lower interlayer dielectric layer 103 to electrically contact the common drains 310d, respectively. The conductive pillars 105 may be arranged in the second direction to constitute one column. Alternatively, the conductive pillars 105 may be arranged in a zigzag-shape in the second direction.

The contact-mold layer 110, the interconnections 150, the barrier dielectric patterns 160, and the spacers 170 described with reference to FIGS. 1A to 2C may be disposed on the lower interlayer dielectric layer 103. An upper interlayer dielectric layer 190 may be disposed on the interconnections 150. Air gaps 180 may be formed between and may extend along the lengths of the interconnections 150. Each of the interconnections 150 may be connected to a top surface of each of the conductive pillars 105. Thus, the interconnections 150 may be electrically connected to the common drains 310d, respectively. The interconnections 150 may correspond to bit lines of a semiconductor memory device. In the present embodiment, the interconnections 150 may be electrically connected to drains of the string selection transistors of the cell strings horizontally arranged on the substrate 100.

Figure 13B:
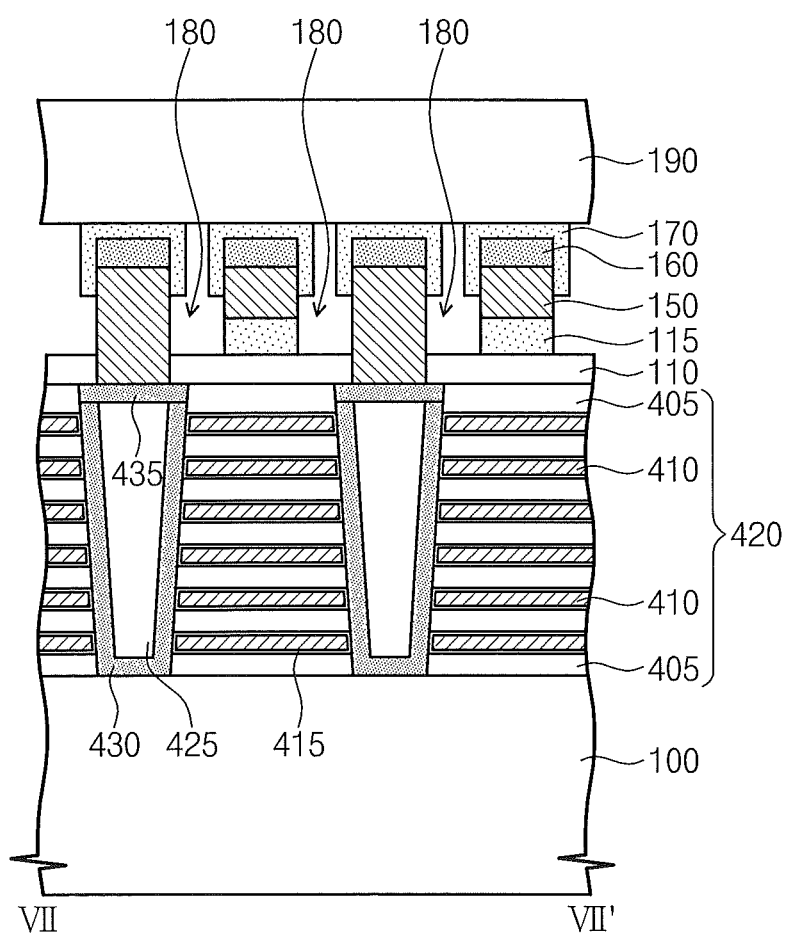
FIG. 13B is a cross-sectional view taken along a line VII-VII' of FIG. 13A.
Figure 13C:
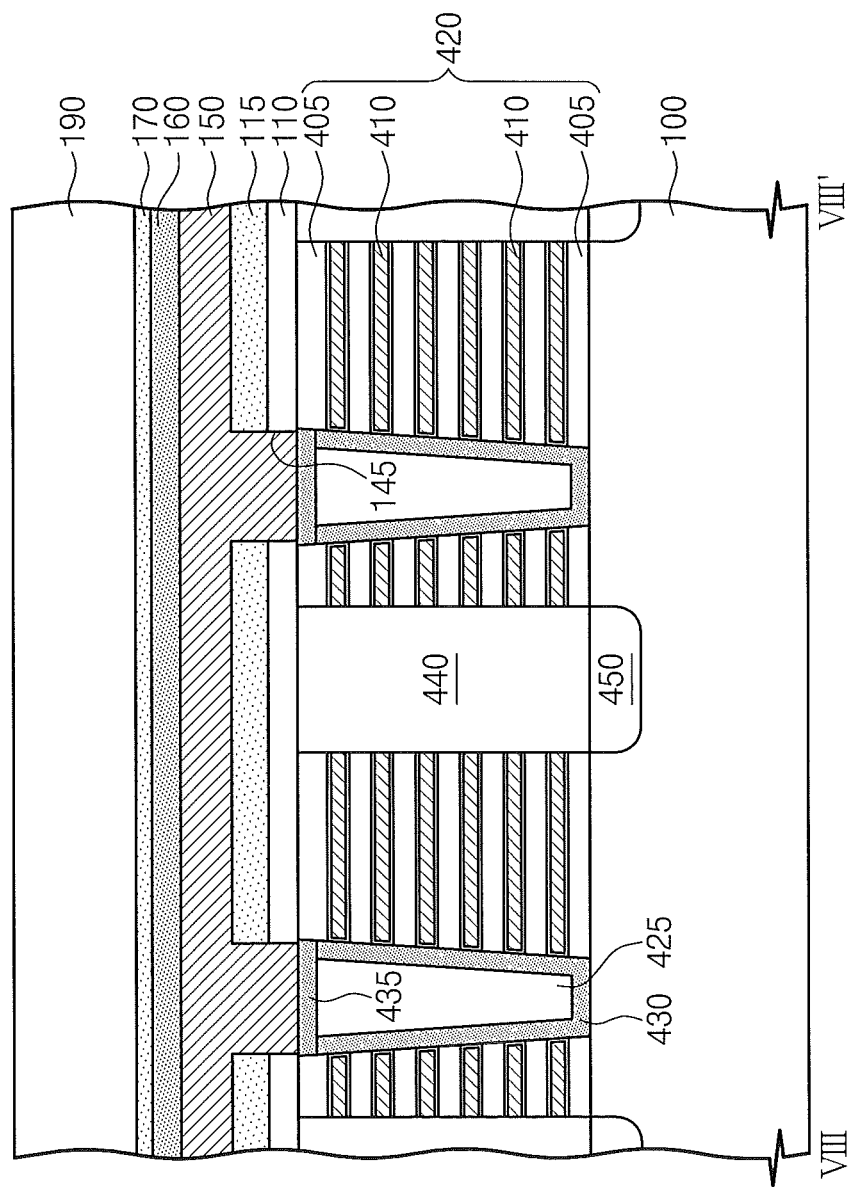
FIG. 13C is a cross-sectional view taken along a line VIII-VIII' of FIG. 13A.

FIG. 13A is a plan view illustrating a semiconductor device according to yet other embodiments of the inventive concept, FIG. 13B is a cross-sectional view taken along line VII-VII' of FIG. 13A, and FIG. 13C is a cross-sectional view taken along line VIII-VIII' of FIG. 13A. Another type semiconductor memory device is illustrated in the present embodiment.

Referring to FIGS. 13A to 13C, a plurality of gate structures 420 may be disposed on a substrate 100. The gate structures 420 may be spaced apart from each other in a first direction. The gate structures 420 may extend in parallel to each other in a second direction perpendicular to the first direction. The first direction and the second direction may correspond to an x-axis direction and a y-axis direction of FIG. 13A, respectively. The substrate 100 may be doped with dopants of a first conductivity type.

Each of the gate structures 420 may include dielectric patterns 405 and gate patterns 410 that are alternately and repeatedly stacked. A plurality of vertical active patterns 430 may successively penetrate or extend through the dielectric patterns 405 and the gate patterns 410 that are alternately and repeatedly stacked. The vertical active patterns 430 may be in contact with the substrate 100. In some embodiments, the vertical active patterns 430 penetrating each of the gate structures 420 may be arranged in a zigzag-shape in the second direction. The vertical active pattern 430 may include a semiconductor material. The vertical active pattern 430 may be undoped. Alternatively, the vertical active pattern 430 may be doped with dopants of the first conductivity type.

A data storing layer 415 may be disposed between a sidewall of the vertical active pattern 430 and the gate patterns 410. The data storing layer 415 may include a tunnel dielectric layer, a charge storing layer, and a blocking dielectric layer. The tunnel dielectric layer may be adjacent to the vertical active pattern 430 and the blocking dielectric layer may be adjacent to the gate patterns 410. The charge storing layer may be disposed between the tunnel dielectric layer and the blocking dielectric layer.

In some embodiments, the vertical active pattern 430 may have a shell-shape in which the inside is empty or hollow. In this case, the inside of the vertical active pattern 430 may be filled with a filling dielectric pattern 425. A capping semiconductor pattern 435 may be disposed on the filling dielectric pattern 425. The capping semiconductor pattern 435 may be in contact with the vertical active pattern 430. At least the capping semiconductor pattern 435 may be doped with dopants of a second conductivity type to form a common drain. Alternatively, the vertical active pattern 430 may have a pillar-shape. For example, the vertical active pattern 430 may be a solid or continuous layer of semiconductor material. In this case, the filling dielectric pattern 425 and the capping semiconductor pattern 435 may be omitted.

If the vertical active pattern 430 has the pillar-shape, a portion of the vertical active pattern 430, that is higher than the uppermost gate pattern of the gate patterns 410, may be doped with dopants of the second conductivity type to form the common drain. A common source region 450 may be disposed in the substrate 100 between the gate structures 420. The common source region 450 may be doped with dopants of the second conductivity type. A device isolation pattern 440 may fill a space between the gate structures 420.

The lowermost gate pattern of the stacked gate patterns 410 in each of the gate structures 420 may be included in a ground selection transistor. The uppermost gate pattern of the stacked gate patterns 410 in each of the gate structures 420 may be included in a string selection transistor. The stacked gate patterns between the lowermost and uppermost gate patterns may be included in or define cell transistors, respectively. A cell transistor may be formed at a crossing point of the vertical active, pattern 430 and each of the stacked gate patterns between the lowermost and uppermost gate patterns. The cell transistors may have non-volatile characteristics. For example, an uppermost and a lowermost one of the gate patterns 410 may define a string selection lines (SSL) and a ground selection line (GSL) of a non-volatile memory device, while ones of the gate patterns 410 between the uppermost and lowermost gate structures may define word lines of the non-volatile memory device. The ground selection transistor, the cell transistors, and the string selection transistor stacked along the vertical active pattern 430 may be connected in series to constitute a cell string. The transistors in the cell string may be vertically stacked on a top surface of the substrate 100.

The contact-mold layer 110, the interconnections 150, the barrier dielectric patterns 160, and the spacers 170 described with reference to FIGS. 1A to 2C may be disposed on the gate structures 420 and the device isolation pattern 440. An upper interlayer dielectric layer 190 may be disposed on the interconnections 150. Here, air gaps 180 may be disposed between the interconnections 150. The contact part of each of the interconnections 150 may be connected to the common drain. The interconnections 150 may be electrically connected to the plurality of vertical active patterns 430 penetrating each of the gate structures 420, respectively.

The semiconductor devices described above may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the semiconductor device according to one of the above embodiments is mounted may further include at least one semiconductor device (e.g., a controller and/or a logic device) that performs other functions.

Figure 14:
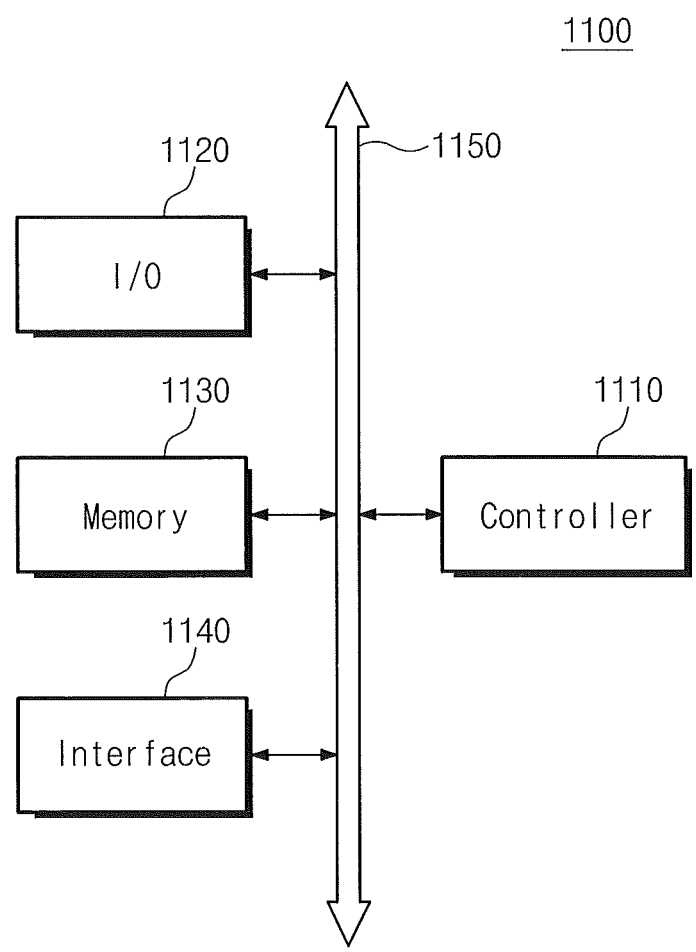
FIG. 14 is a schematic block diagram illustrating an example of electronic systems including the semiconductor devices according to, embodiments of the inventive concept.

FIG. 14 is a schematic block diagram illustrating an example of electronic systems including the semiconductor devices according to embodiments of the inventive concept.

Referring to FIG. 14, an electronic system 1100 according to some embodiments of the inventive concept may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, and/or other logic devices. Such logic devices may have a similar function to any one of the microprocessor, the digital signal processor and the microcontroller. If the semiconductor devices according to embodiments described above may be realized as logic devices, the controller 1110 may include at least one of the semiconductor devices according to embodiments described above. The I/O unit 1120 may include a keypad, a keyboard and/or a display unit. The memory device 1130 may store data and/or commands. The memory device 1130 may include at least one of the semiconductor memory devices according to the embodiments described above, for example, non-volatile memory devices. The memory device 1130 may further include other types of semiconductor memory devices (e.g., a volatile memory device such as a DRAM device and/or a SRAM device) which are different from the semiconductor devices described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to or otherwise implemented in a personal digital assistant (PDA), a portable computer, a web tablet, a wireless phone, a mobile phone, a digital music player, a memory card or other electronic products. One or more of such electronic products may receive or transmit information data wirelessly.

Figure 15:
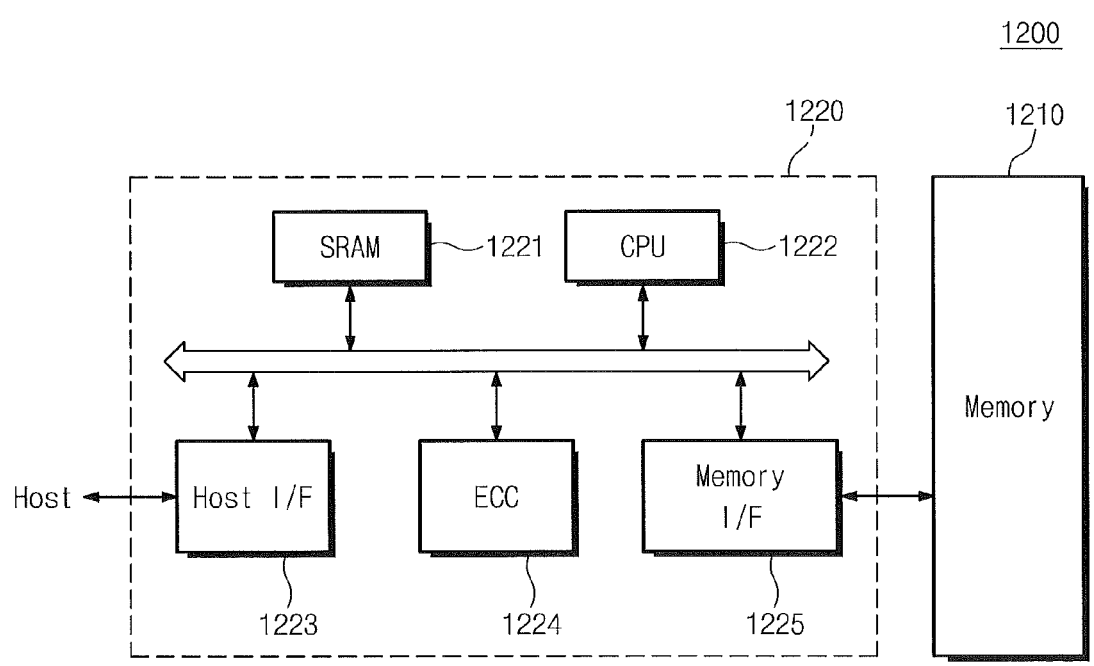
FIG. 15 is a schematic block diagram illustrating an example of memory cards including the semiconductor devices according to embodiments of the inventive concept.

FIG. 15 is a schematic block diagram illustrating an example of a memory card including the semiconductor devices according to embodiments of the inventive concept.

Referring to FIG. 15, a memory card 1200 according to some embodiments of the inventive concept may include a memory device 1210. The memory device 1210 may include at least one of the semiconductor memory devices according to the embodiments mentioned above, for example, non-volatile memory devices. In other embodiments, the memory device 1210 may further include other types of semiconductor memory devices (e.g., a volatile memory device such as a DRAM device and/or a SRAM device) which are different from the semiconductor devices according to the embodiments described above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. The memory card 1200 may further include a read only memory (ROM) device that stores code data to interface with the host. The memory card 1200 may be used as a portable data storage card. Alternatively, the memory card 1200 may be realized as or implemented in solid state disks (SSD) which are used as hard disks of computer systems.

According to the embodiments described above, the upper interlayer dielectric layer may be disposed on the interconnection to form air gaps between the interconnections. Thus, the parasitic capacitance between the interconnections may be reduced or minimized to provide integrated circuit devices with excellent reliability.

Additionally, since the barrier dielectric patterns are formed on only the top surfaces of the interconnections, hydrogen atoms that may be included in interlayer dielectric layers may be easily exhausted. Thus, it may be possible to reduce or minimize reliability deterioration of the integrated circuit device that may be caused by the hydrogen atoms.

Furthermore, since the spacers cover the barrier dielectric patterns and the interconnections, a distance between the interconnections may be reduced. Thus, it is possible to prevent the upper interlayer dielectric layer from inflowing or otherwise intruding into the spaces/air gaps between the interconnections. As a result, reproducibility of the air gaps may be improved.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of fabricating a semiconductor device, the method comprising:
   forming interconnections extending in a first direction on a substrate, wherein the interconnections are spaced apart from each other in a second direction different than the first direction;
   forming barrier dielectric patterns on top surfaces of the interconnections, respectively, such that upper sidewalls of the interconnections are free of the barrier dielectric patterns; and
   forming an upper interlayer dielectric layer on the interconnections,
   wherein an air gap is defined between adjacent ones of the interconnections.

2. The method of claim 1, wherein forming the interconnection comprises:
   forming an interconnection-mold layer including recess regions therein on the substrate, the recess regions extending in parallel to each other in the first direction and spaced apart from each other in the second direction perpendicular to the first direction; and
   forming the interconnections in the recess regions, respectively,
   the method further comprising:
   forming spacers on the barrier dielectric patterns and the interconnections, respectively; and
   removing the interconnection-mold layer between the interconnections prior to forming the upper interlayer dielectric layer thereon so as to define respective air gaps between the adjacent ones of the interconnections.

3. The method of claim 2, wherein forming the spacers comprises:
   etching a portion of the interconnection-mold layer to expose the barrier dielectric patterns and the upper sidewalls of the interconnections; and
   forming the spacers on the exposed barrier dielectric patterns and the exposed upper sidewalls of the interconnections,
   wherein the barrier dielectric patterns and the spacers include materials having an etch selectivity with respect to the interconnection-mold layer.

4. The method of claim 3, wherein the spacers extend toward the substrate along the upper sidewalls of the interconnections and beyond respective surfaces thereof including the barrier dielectric patterns thereon.

5. The method of claim 3, wherein the spacers comprise a material that is resistant to diffusion of hydrogen atoms, and further comprising:
   removing top portions of the spacers such that sidewall portions of the spacers remain on the upper sidewalls of the interconnections prior to forming the upper interlayer dielectric layer.

6. The method of claim 3, wherein the air gap is bounded by the spacers, the adjacent ones of the interconnections, and the upper interlayer dielectric layer.

7. The method of claim 6, wherein a distance between adjacent ones of the spacers is less than a distance between the adjacent ones of the interconnections.

8. The method of claim 7, wherein the air gap continuously extends from a sidewall of one of the adjacent ones of the interconnections to a sidewall of another of the adjacent ones of the interconnections without portions of the upper interlayer dielectric layer therebetween such that the sidewalls of the adjacent ones of the interconnections are free of the upper interlayer dielectric layer.

9. The method of claim 3, wherein the spacers are insulating spacers extending between the barrier dielectric patterns and the upper interlayer dielectric layer.

10. The method of claim 3, wherein the spacers comprise silicon nitride (SiN), silicon oxynitride (SiON), silicon carbide (SiC), silicon carbon nitride (SiCN), titanium (Ti), tantalum (Ta), titanium nitride (TiN), and/or tantalum nitride (TaN).

11. The method of claim 2, further comprising:
forming a blocking dielectric pattern between the interconnections and the interconnection-mold layer, wherein the blocking dielectric pattern has an etch selectivity with respect to the interconnection-mold layer.

12. The method of claim 1, wherein forming the barrier dielectric patterns comprises:
etching upper portions of the interconnections;
forming a barrier dielectric layer on the etched upper portions of the interconnections such that the upper sidewalls of the interconnections are free of the barrier dielectric layer; and
planarizing the barrier dielectric layer until the interconnection-mold layer is exposed.

13. The method of claim 1, wherein the barrier dielectric patterns comprise silicon nitride, metal nitride, and/or cobalt.

14. The method of claim 1, further comprising:
forming a plurality of cell strings on the substrate, each of the cell strings including a string selection transistor, a ground selection transistor, and a plurality of cell transistors connected in series between the string and ground selection transistors;
wherein the interconnections are electrically connected to drain regions of the string selection transistors, respectively.

15. The method of claim 14, wherein the interconnections comprise bit lines of a non-volatile integrated circuit memory device that are electrically connected to the drain regions of the string selection transistors, respectively.

16. A method of fabricating a semiconductor device, the method comprising:
forming a plurality of interconnections extending substantially parallel along a substrate and spaced apart from one another;
forming barrier dielectric patterns on top surfaces of the interconnections, respectively;
forming insulating spacers on the barrier dielectric patterns and the interconnections, respectively; and
forming an upper dielectric layer on the interconnections, the upper dielectric layer spaced apart from the barrier dielectric patterns with the insulating spacers therebetween,
wherein an air gap is defined between adjacent ones of the interconnections.

17. The method of claim 16, wherein forming the plurality of interconnections comprises:
forming an interconnection-mold layer including a plurality of recess regions therein on the substrate, the recess regions extending substantially parallel along a substrate and spaced apart from one another; and
forming the interconnections in the recess regions, respectively,
the method further comprising:
removing the interconnection-mold layer between the interconnections prior to forming the upper interlayer dielectric layer thereon so as to define respective air gaps between the adjacent ones of the interconnections.

18. The method of claim 16, wherein the air gap continuously extends from a sidewall of one of the adjacent ones of the interconnections to a sidewall of another of the adjacent ones of the interconnections without portions of the upper interlayer dielectric layer therebetween such that the sidewalls of the adjacent ones of the interconnections are free of the upper interlayer dielectric layer.

* * * * *